United States Patent
Oh et al.

(10) Patent No.: US 8,243,518 B2
(45) Date of Patent: Aug. 14, 2012

(54) NAND FLASH MEMORY DEVICE AND METHOD OF MAKING SAME

(75) Inventors: Dong-Yean Oh, Seoul (KR); Woon-Kyung Lee, Seongnam-si (KR); Seung-Chul Lee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 584 days.

(21) Appl. No.: 12/424,135

(22) Filed: Apr. 15, 2009

(65) Prior Publication Data

US 2009/0287879 A1 Nov. 19, 2009

(30) Foreign Application Priority Data

May 19, 2008 (KR) .................. 10-2008-0046129

(51) Int. Cl.
*G11C 11/34* (2006.01)
(52) U.S. Cl. .......... 365/185.18; 365/185.24; 365/185.29
(58) Field of Classification Search ............. 365/185.11, 365/185.18, 185.17, 185.3, 185.29, 185.24
See application file for complete search history.

(56) References Cited

U.S. PATENT DOCUMENTS

| | | | |
|---|---|---|---|
| 5,677,873 A | 10/1997 | Choi et al. | |
| 5,991,202 A | 11/1999 | Derhacobian et al. | |
| 6,858,906 B2 | 2/2005 | Lee et al. | |
| 7,177,191 B2 * | 2/2007 | Fasoli et al. | 365/185.17 |
| 7,184,309 B2 | 2/2007 | Matsunaga et al. | |
| 7,253,467 B2 | 8/2007 | Lee et al. | |
| 2004/0080980 A1 * | 4/2004 | Lee | 365/185.17 |
| 2006/0180851 A1 | 8/2006 | Lee et al. | |
| 2007/0001213 A1 | 1/2007 | Om et al. | |
| 2007/0140012 A1 * | 6/2007 | Roohparvar | 365/185.17 |
| 2009/0067242 A1 * | 3/2009 | Jeon et al. | 365/185.11 |
| 2010/0124118 A1 * | 5/2010 | Lee et al. | 365/185.17 |

FOREIGN PATENT DOCUMENTS

| | | |
|---|---|---|
| JP | 2002-151604 | 5/2002 |
| JP | 2007019474 | 1/2007 |
| KR | 1020070004351 | 1/2007 |
| KR | 1020070050173 | 5/2007 |

* cited by examiner

*Primary Examiner* — VanThu Nguyen
*Assistant Examiner* — Hien Nguyen
(74) *Attorney, Agent, or Firm* — F. Chau & Associates, LLC

(57) ABSTRACT

An integrated circuit includes a NAND string including a string selection transistor SST and a ground selection transistor GST disposed at either end of series-connected memory storage cells MC. Each of the memory storage cells is a memory transistor having a floating gate, and at least one of the string selection transistor SST and the ground selection transistor GST is a memory transistor having a floating gate. The threshold voltage Vth of programmable string selection transistors SST and the ground selection transistor GST is variable and user controllable and need not be established by implantation during manufacture. Each of the programmable string selection transistors SST and the ground selection transistors GST in a memory block may be used to store random data, thus increasing the memory storage capacity of the flash memory device.

18 Claims, 24 Drawing Sheets

< all block erasing >

< one-pulse programming >

< Verify Reading >

< SST PGM-inhibit >

< GST Programming >

< GST programming :one-pulse or ISPP without PGM inhibit >

NAND FLASH MEMORY DEVICE AND METHOD OF MAKING SAME

CROSS-REFERENCE TO RELATED APPLICATIONS

This application claims priority under 35 U.S.C. 119 to Korean patent application no. 10-2008-0046129, filed on May 19, 2008, the entire content of which is incorporated by reference herein.

BACKGROUND

1. Technical Field

The present invention generally relates to flash memory devices, and more particularly, to a method of forming selection transistors as memory transistors in a NAND type flash EEPROM.

2. Discussion of the Related Art

Non-volatile memory devices, such as flash memory devices, may be provided in a NOR-type configuration or a NAND-type configuration and can be electrically rewritten and formed with high integration density. NAND-type nonvolatile semiconductor memory devices include a plurality of NAND cell units. Each NAND cell unit is configured by serially connecting a plurality of memory transistors in a column direction between a source and a drain. Selection gate (SG) transistors are connected to at each end of the series-connected memory transistor circuit.

Two types of non-volatile memory transistors are floating gate type memory transistors and floating trap (charge trap) type memory transistors. A floating gate type memory transistor includes a control gate and a conductive floating gate that is isolated, by an insulating layer, from a field effect transistor (FET) channel formed in a substrate. Floating gate type memory transistors may be programmed by storing charges as free carriers on the conductive floating gate.

A floating gate type memory transistor is similar to a standard MOSFET transistor, except that it has two gates instead of just one. One gate is the control gate (CG) like in other MOSFET transistors, but the second gate is a floating gate (FG) that is insulated all around by an oxide insulator. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the control gate (CG), electrical current will either flow or not flow between the cell's source and drain connections, depending on the threshold voltage (Vt) of the cell. This presence or absence of current is sensed and translated into 1's and 0's, reproducing the stored data.

Floating trap (charge trap) type memory transistors may include a non-conductive charge storage layer between a gate electrode and a field effect transistor (FET) channel formed in a substrate. Floating trap type memory transistors may be programmed by storing charges in traps in the non-conductive charge storage layer.

When a positive voltage is applied on the gate electrode, electrons are tunneled via the tunneling insulating layer to become trapped in the charge storage layer. As the electrons are accumulated in the charge storage layer, a threshold voltage of the memory transistor is increased, and the memory transistor becomes programmed. In contrast, when a negative voltage is applied to the gate electrode, trapped electrons are discharged to the semiconductor substrate via the tunneling insulating layer. Concurrently, holes become trapped by the tunneling insulating layer. Consequently, the threshold voltage of the memory transistor is decreased, and the memory transistor becomes erased.

Conventional NAND Flash memory strings typically are isolated from other strings by shallow trench isolation (STI), that prevents electrical current leakage between adjacent semiconductor device components, and have three types of transistors which are: the memory transistor transistors (implementing nonvolatile data-storage memory transistors); string select transistors SST; and ground select transistors GST. Typically, in a NAND flash memory device, string selection and ground selection transistors (SSL and GSL) are disposed at the ends of a NAND string and are used to select the NAND string during program, erase and read operations.

A group of NAND cell units (NAND strings) arranged in a row direction is called a NAND cell block (memory block, MB). The gates of selection transistors SST and GST arranged on the same row are commonly connected to a corresponding one of selection gate lines and the control gates of memory transistors arranged on the same row are commonly connected to a corresponding one of control gate lines. If n memory transistors are serially connected in the NAND cell unit, the number of control gate lines of memory transistors contained in one NAND cell block is n.

When programming data, first, all data items stored in all memory transistors of memory storage cells in the entire memory block (MB) are simultaneously erased. The erase process is performed by setting all of the control gate lines (word lines) of memory transistors in the selected memory block to a low voltage Vss (for example, 0V) and applying high positive voltage Vera (erase voltage, for example, 20V) to a p-type well region in which the memory cell array is formed to discharge electrons in the floating gates into the channel regions. As a result, all data items stored in all memory transistors of memory storage cells in the entire memory block are all set to "1" data. Multiple or all memory blocks can be simultaneously erased.

After the above-described simultaneous data erase step, the data programming process is simultaneously performed for a plurality of memory transistors connected to a selected control gate line. The unit of binary data to be programmed in the memory transistors connected to a selected control gate line is generally defined as one "page" of data. The "page" order in which data is programmed into the memory transistors (pages) in the memory block is based either on a system in which data is programmed in a random order (random programming process) or on a system in which data is sequentially programmed in one direction (sequential programming process). In the sequential programming process, generally, data is programmed in sequential pages in order from the source-side memory transistor.

If high positive voltage Vpgm (program voltage, for example, 20V) is applied to a selected control gate line in the simultaneous programming process, electrons are injected from the channel of the memory transistor into the floating gate in the case of "0" data (so-called "0" programming or "0" write). In this case, injection of electrons is inhibited in the case of "1" data (so-called program inhibition, "1" programming or "1" write). Thus, while writing random data into memory transistors of one page, two types of data programming operations are simultaneously performed and it is necessary to control the channel voltage of each memory transistor according to its program data. For example, in the case of "0" data, the channel voltage is kept low so as to apply a strong electric field to the gate insulating film under the floating gate when the program voltage Vpgm is applied to the control gate. In the case of "1" data, the channel voltage is boosted so as to make weak the electric field applied to the gate insulating film and inhibit injection of electrons into the floating gate. If the channel voltage is insufficiently boosted, electrons are injected so that the threshold voltage of the memory transistor to be subjected to the "1" programming process will be changed. This phenomenon is referred as "erroneous programming" or "write error" or "program disturb". Therefore, in order to realize the programming operation of the NAND type flash EEPROM, it is necessary to suppress variation in the threshold voltage due to erroneous programming within a specified range so as not to cause erroneous operation.

In a conventional NAND Flash memory string, the select transistors SST and GST are standard MOSFET transistors, each having one control gate.

A leakage current may occur in unselected strings in unselected blocks during a read operation of a selected block, thereby causing read error to occur. Hence, it is necessary to control the leakage current of the select transistor. To this end, conventionally a threshold voltage implant is performed during manufacture in the select transistor region, requiring additional (e.g., mask, implantation) steps in a method of manufacturing the NAND flash memory device.

For the purpose of controlling threshold-voltage distributions of programmed memory cells densely and precisely, an incremental step pulse programming (ISPP) mode is often used. According to the ISPP mode, a programming voltage applied to a word line rises stepwise up during repetition of loops of programming cycle. The programming voltage increases by a predetermined step increment ($\Delta V$), also referred to as a "rising rate". During the programming sequence, a cell threshold voltage of a programmed cell increases at a rate predetermined for each programming loop. Programming of a nonvolatile memory device by means of the ISPP mode is disclosed in U.S. Pat. No. 6,266,270, entitled "Non-Volatile Semiconductor Memory and Programming Method of the Same". Each programming loop generally is divided into programming and program-verifying periods. In the programming period, memory cells are programmed under a given bias condition as is well known in this art. In the program-verifying period, the memory cells programmed once are verified whether they are conditioned in the target threshold voltages. The programming loops are repeated for a predetermined number of times until all memory cells are completely programmed at the target threshold voltages. As well known, the program-verifying operation is similar to a reading operation, except that read data is not output to external of the device.

SUMMARY OF THE INVENTION

An aspect of the invention provides NAND cell units including selection transistors (e.g., string select transistors SST and/or ground select transistors GST) that are programmable memory transistors. The selection transistors SST and GST may be formed as memory transistors each having a floating gate in addition to a control gate. Thus, the threshold voltage Vth of the selection transistors SST and GST can be controlled by the user who may control the extent that the selection transistors SST and GST are programmed. If memory storage cells disposed between the selection transistors SST and GST in the same NAND cell unit are formed as memory transistors each having a floating gate in addition to a control gate, then conventionally necessary fabrication steps for creating a butting contact between the control gate and a dummy floating gate formed in the selection transistors SST and GST can be avoided. Further, because the string selection transistor SST and the ground selection transistor GST in each NAND cell unit in every memory block become a read/write accessible memory transistor, additional data can be stored in cell unit. The method comprises: simultaneously (bulk) erasing all of the memory cell transistors in the first memory block among the plurality of memory blocks (or in all memory blocks); then programming all the memory cell transistors connected to a first wordline in the first memory block; then programming and program-inhibiting all first selection transistors (e.g., string selection transistors SST) in every NAND cell unit of the first memory block. The method preferably further comprises verifying the threshold voltage of each first selection transistor (e.g., string selection transistors SST) to have a predetermined threshold voltage. The memory cell transistors of the flash memory device may be memory transistors of the floating gate type and the first selection transistors (e.g., string selection transistors SST) and also the second selection transistors (e.g., ground selection transistors GST) may be memory transistors of the floating gate type.

Another aspect of the invention provides a solid state memory module for a computer system, the module comprising: a housing; an interface connector on the housing; a flash memory controller located within the housing, and an integrated circuit including the NAND cell units including string selection transistors SST and/or ground selection transistors GST that are memory transistors (e.g., of the floating gate type). The interface connector may be an IDE interface connector including a forty IDE pin interface and a power connector, or the housing may have an SD card form factor and the interface connector has eight electrical contact pads. Alternatively, the housing may have the form factor of any of a MS (memory stick), CF (compact flash), SMC (smart media), MMC (multi media), SD (Secure Digital), or XD (XD-Picture Card).

Another aspect of the invention provides a computer system comprising the solid state memory module. The computer system may be a personal computer (PC), a personal digital assistant (PDA), an MP3 player, a digital audio recorder, a pen-selection transistors SST and GST in each memory block, thus increasing the capacity of Flash memory devices. And because the gate lengths of the control gates of selection transistors may be the same as the gate length of the control gates of the memory storage cells MC (MC0, MC1, MCi-2, MCi-1), the integration and scalability of NAND flash devices may be improved.

An aspect of the invention provides a flash memory device, comprising: a plurality of memory blocks, each memory block including a NAND cell unit having a first selection transistor connected in series to a plurality of memory cells controlled by respective wordlines, wherein each memory cell is a memory transistor, wherein the first selection transistor is a memory transistor. Each NAND cell unit may further comprise a second selection transistor (e.g., GST) connected in series to a plurality of memory cells, and the second selection transistor (e.g., GST) may also be a memory transistor. Every memory cell transistor may include a control gate and a floating gate. The first selection transistor may be a string selection transistor SST controlled by a string selection line SSL, and the second selection transistor may be a ground selection transistor GST controlled by a ground selection line. The first selection transistor being a memory transistor has a variably programmable threshold voltage, and thus its threshold voltage need not be fixed by implantation at time of manufacture.

Another aspect of the invention provides a method of programming a flash memory device having an plurality of NAND cell units in each of a plurality of memory blocks, a plurality of memory cell transistors in each NAND cell unit controlled by respective wordlines, a first selection line connected to a first selection transistor in each of the NAND cell units in a memory block, each first selection transistor being a memory transistor connected in series to the plurality of memory cell transistors in each NAND shaped computer, a digital camera, or a video recorder.

BRIEF DESCRIPTION OF THE DRAWINGS

The above and other features of exemplary embodiments of the present invention will become readily apparent to persons skilled in the art by reference to the following detailed description when considered in conjunction with the accompanying drawings wherein.

DETAILED DESCRIPTION OF EXEMPLARY EMBODIMENTS

Figure 1:
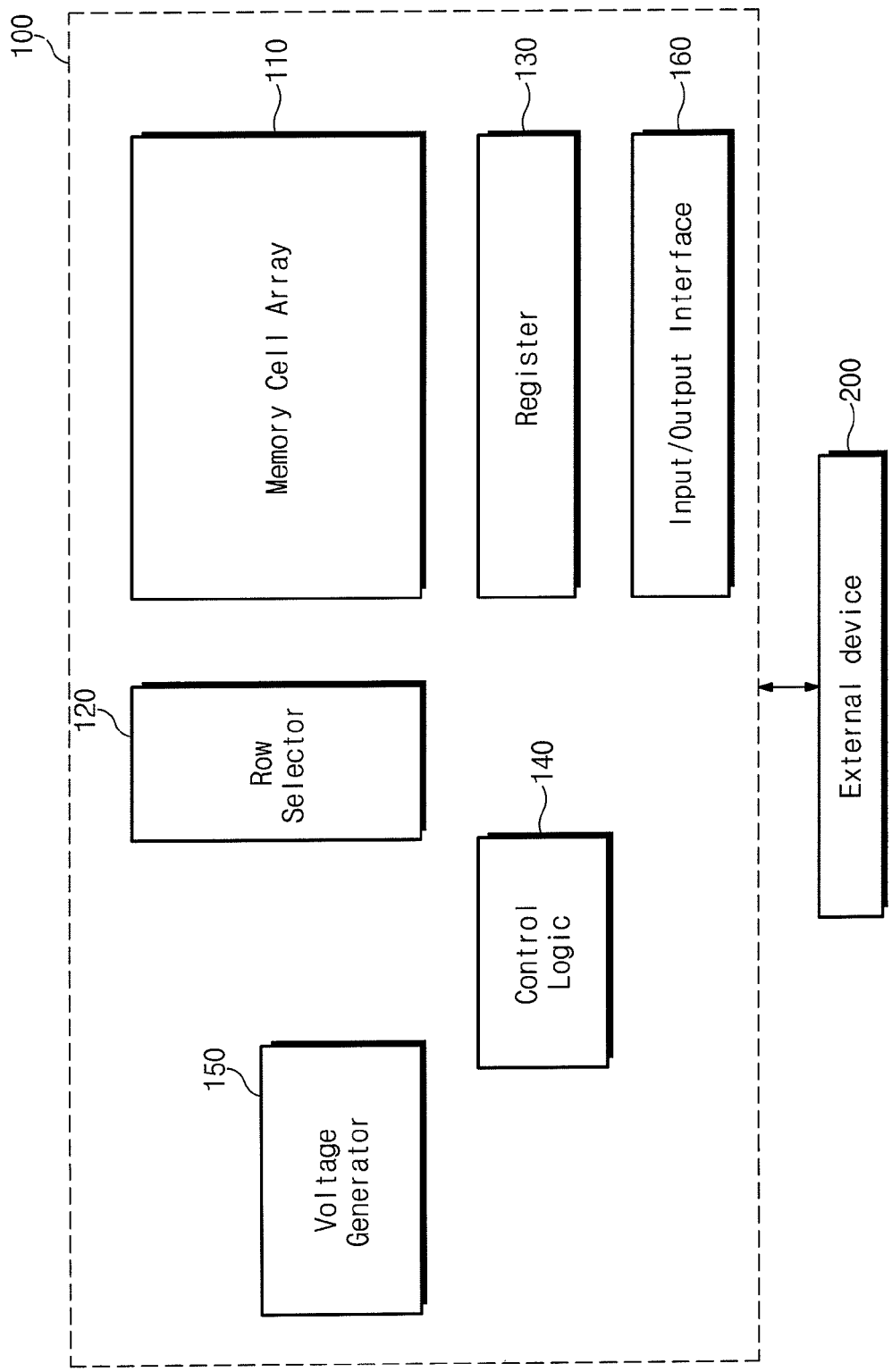
FIG. 1 is a block diagram of a flash memory device 100 according to an embodiment of the present invention, connected to a host (external) device 200.

FIG. 1 is a block diagram of a flash memory device 100 (e.g., a flash memory card or solid state disk) according to an embodiment of the present invention, connected to host (external) device 200. The removable memory card 100 will typically have a housing that has a predetermined form factor and interface, such as SD (Secure Digital), MS (memory stick), CF (compact flash), SMC (smart media), MMC (multi media), or XD (XD-Picture Card), PCMCIA, CardBus, IDE, EIDE, SATA, SCSI, universal serial bus e.g., a USB flash drive, etc.

The memory card 100 further includes a memory controller (not shown) which controls data flow and commands between a memory Input/Output interface 160 and the flash memory transistors (in memory cell array 110). Some examples of the external device 200 include personal computers, file servers, peripheral devices, wireless devices, digital cameras, personal digital assistants (PDA's), MP3 audio players, MPEG video players, and audio recorders. It will be appreciated by those skilled in the art that additional circuitry and control signals can be provided, and that the computer system of FIG. 1 has been simplified.

The flash memory device 100 includes a memory cell array 110, a row (X) selector 120, a register block 130, an Input/Output interface 160, a voltage generator 150, and control logic 140. The register block (data input/output buffer) 130 latches program data, senses and latches data at the readout time. The Voltage Generator (booster circuit) 150 creates and generates the program voltage Vpgm, a plurality of different intermediate voltages (e.g., Vpass1 to Vpassn) and a bit line voltage Vbl from the power supply voltage. The row (X) selector 120 supplies a control signal to the Voltage Generator 150 and is supplied with the program voltage Vpgm and the intermediate voltages Vpass1 to Vpassn.

Figure 2:
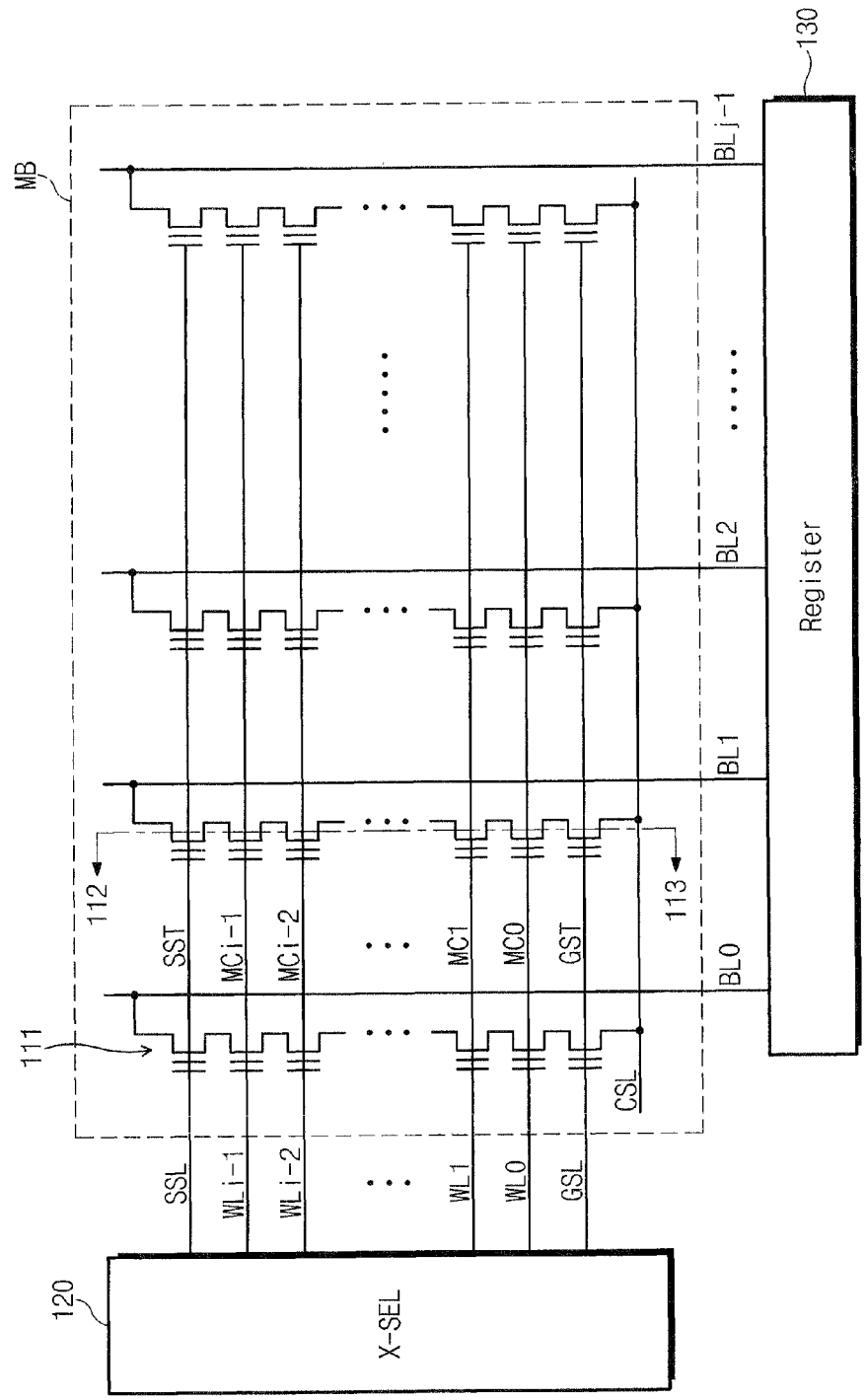
FIG. 2 is a block diagram of a memory block (MB) within the memory cell array (110) in the flash memory device 100 of FIG. 1.

FIG. 2 is a block diagram of an extracted main portion of the flash memory device 100 of FIG. 1 illustrating a memory block (MB) within the memory cell array 110. In FIG. 1 and FIG. 2, only the circuits required for explaining the embodiment are shown. It should be noted that an address buffer and timing generator circuit and the like used to operate the memory device are known to one skilled in the art and are not shown.

Referring to FIG. 1 and FIG. 2, in a memory cell array 110, NAND cell units 111 are arranged in row and column directions in a matrix form, and connected to control gate lines (e.g., word lines $WL_0$-$WL_{i-1}$), bit lines (BL0, BL1, BL2 . . . $BL_{j-1}$), string and ground selection lines (SSL, GSL), and source lines (CSL). The row selection circuit (X-SEL) decodes a row address signal and outputs various voltages that are used to selectively activate the memory storage cells (MC0, MC1, MCi-2, MCi-1), in the NAND cell units 111 in the memory cell array 110 based on the voltage supplied from a booster circuit (not shown). Thus, selected ones of the control gate lines ($WL_0$-$WL_{i-1}$) and selection gate lines (SSL, GSL), in the memory cell array 110 are selected. Further, the bit lines (BL0, BL1, BL2 . . . $BL_{j-1}$) receive the bit line voltage Vbl from the voltage generator (booster circuit) 150 and supply the voltage to the column of the selected NAND cell unit selected by the column decoder (not shown).

In the case of programming, voltages such as the program voltage Vpgm, intermediate voltages Vpass1 to Vpassn and bit line voltage Vbl are generated from the power supply voltage by the voltage generator 150. The above voltages are applied to the control gate lines ($WL_0$-$WL_{i-1}$) and selection gate lines (SSL, GSL), and source line of the selected memory block (MB) via the row selector 120 and data is programmed into a selected memory transistor. The program voltage Vpgm is applied to the selected control gate line and the types of voltages applied to the non-selected control gate lines and the way of applying the voltages to the non-selected control gate lines vary depending upon the position of the selected control gate line in the selected memory block (MB). The memory storage cells (MC0, MC1, MCi-2, MCi-1) may be memory transistors of the floating gate type, and in that case the selection transistors SST and GST may also be memory transistors of the floating gate type and so there is no buffing contact between the control gate and the floating gate in the selection transistors SST and GST.

Figure 3:
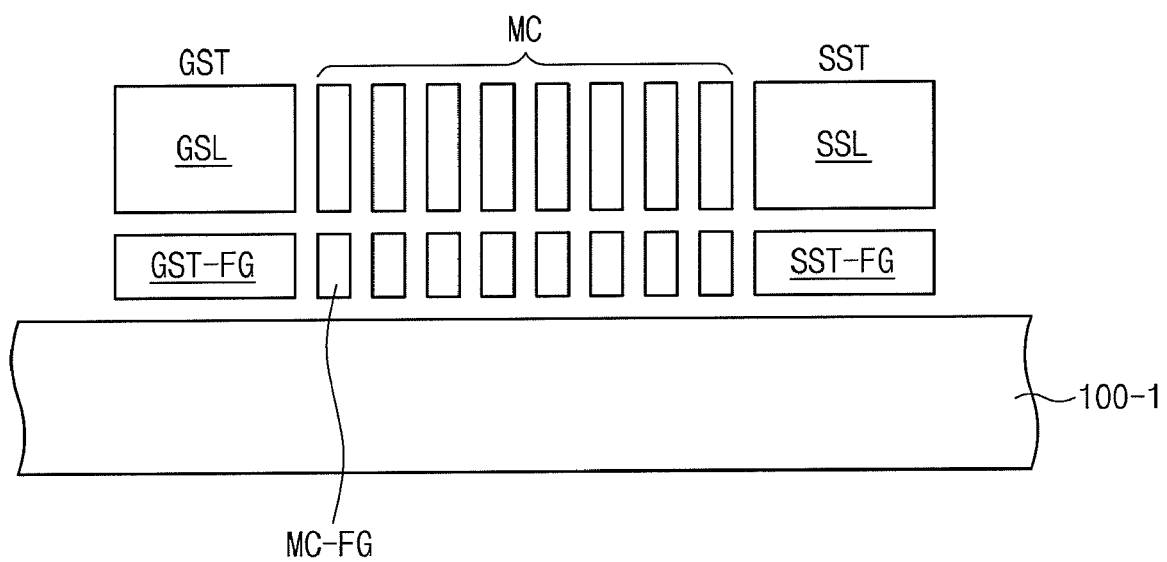
FIG. 3 is a side cross-sectional view of a NAND cell unit in an integrated circuit according to an exemplary embodiment of the present invention, along section line 112-113 in the memory block (MB) within the memory cell array 110 in the flash memory device 100 of FIG. 1.

FIG. 3 is a side cross-sectional view, of a NAND cell unit 111 formed in an integrated circuit according to a first embodiment of the present invention, along section line 112-113 in the memory block (MB) within the memory cell array 110 in the flash memory device 100 of FIG. 1. The NAND cell unit 111 is formed on a semiconductor substrate 100-1. The channel of the NAND cell unit 111 is formed in the semiconductor substrate 100-1 between the selection transistors SST and GST. The channel of the NAND cell unit 111 may be isolated from channels of other adjacent NAND cell units by shallow trench isolation (STI) (not shown), that prevents electrical current leakage between adjacent semiconductor device components. In this exemplary embodiment, both the string selection transistor SST and the ground select transistor GST are memory transistors. Thus, the string selection transistor SST has a control gate (SSL) and a floating gate (SST-FG). And, the ground selection transistor GST has a control gate (GSL) and a floating gate (GST-FG).

The memory storage cells MC (MC0, MC1, MCi-2, MCi-1) may be memory transistors of the floating gate type each having a floating gate MC-FG, and in that case the selection transistors SST and GST may be memory transistors of the floating gate type and there is no butting contact between the control gates (SSL, GSL) and the floating gates (SST-FG, GST-FG) in the selection transistors SST and GST.

In conventional NAND cell units, the gate length of the control gates of selection transistors are longer than the gate length of control gates of memory storage cells MC (MC0, MC1, MCi-2, MCi-1) connected to word lines WL, because selection transistors are normally reliant upon doping during manufacture to achieve an appropriate threshold voltage Vth. In accordance with an exemplary embodiment of the invention, the selection transistors are programmable memory transistors, and the gate lengths of the control gates of selection transistors may be the same as the gate length of the control gates of the memory storage cells MC (MC0, MC1, MCi-2, MCi-1).

Figure 4:
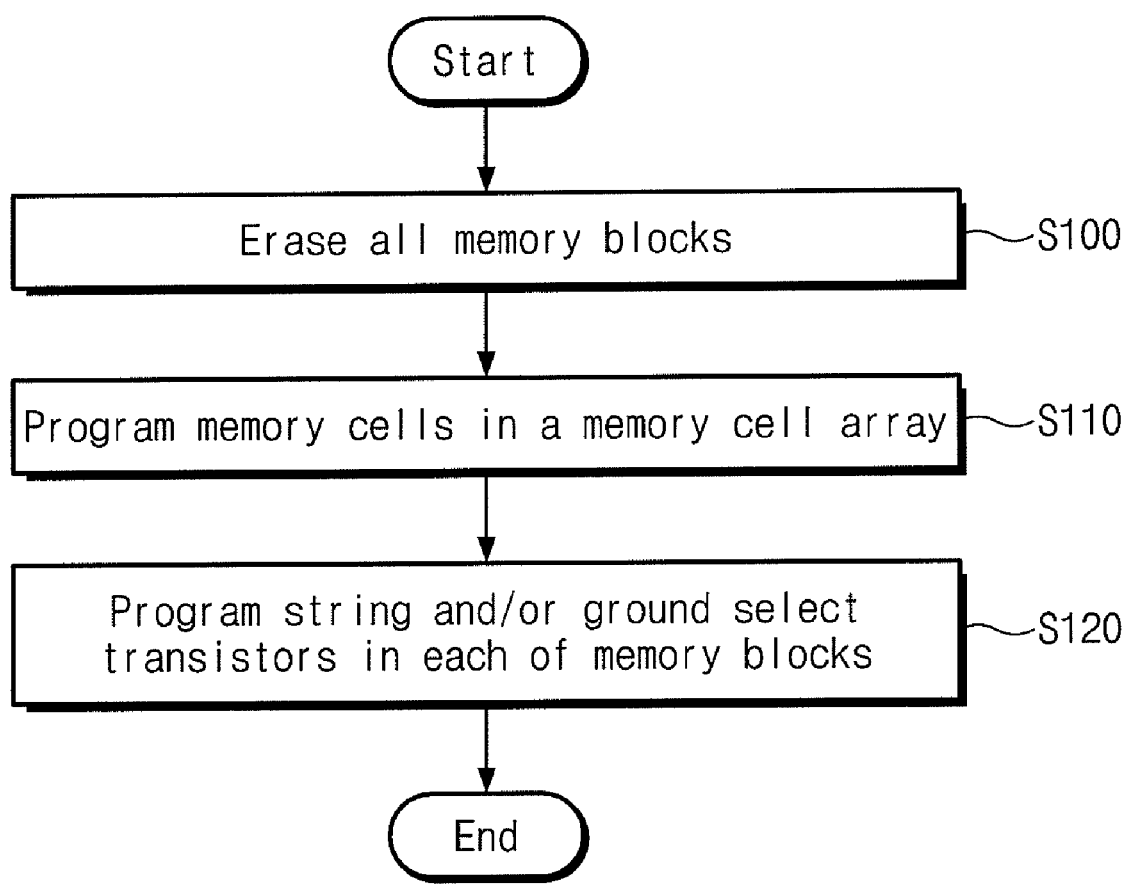
FIG. 4 is a flow chart illustrating a method of incremental step pulse programming (ISPP) of string select transistors SSL and/or ground select transistors GSL in the NAND cell unit of FIG. 3.

FIG. 4 is a flow chart illustrating a method of incremental step pulse programming (ISPP) of string select transistors SSL and/or ground select transistors GSL in the NAND cell unit of FIG. 3, block by block, in the memory blocks (MB) within the memory cell array 110 in the flash memory device 100 of FIG. 1.

Each memory storage cell (memory transistors MC0, MC1, MCi-2, MCi-1) is able to store binary data, (i.e., "program" data "0" involving a high threshold voltage representing that electrons have been injected into the floating gate from a channel thereof, and "erase" or "inhibit" data "1" involving a low threshold voltage representing that electrons have been discharged from the floating gate to the channel). Before data writing, data stored in all the memory storage cells (memory transistors MC0, MC1, MCi-2, MCi-1) of the memory block are beforehand erased collectively.

Figure 6:
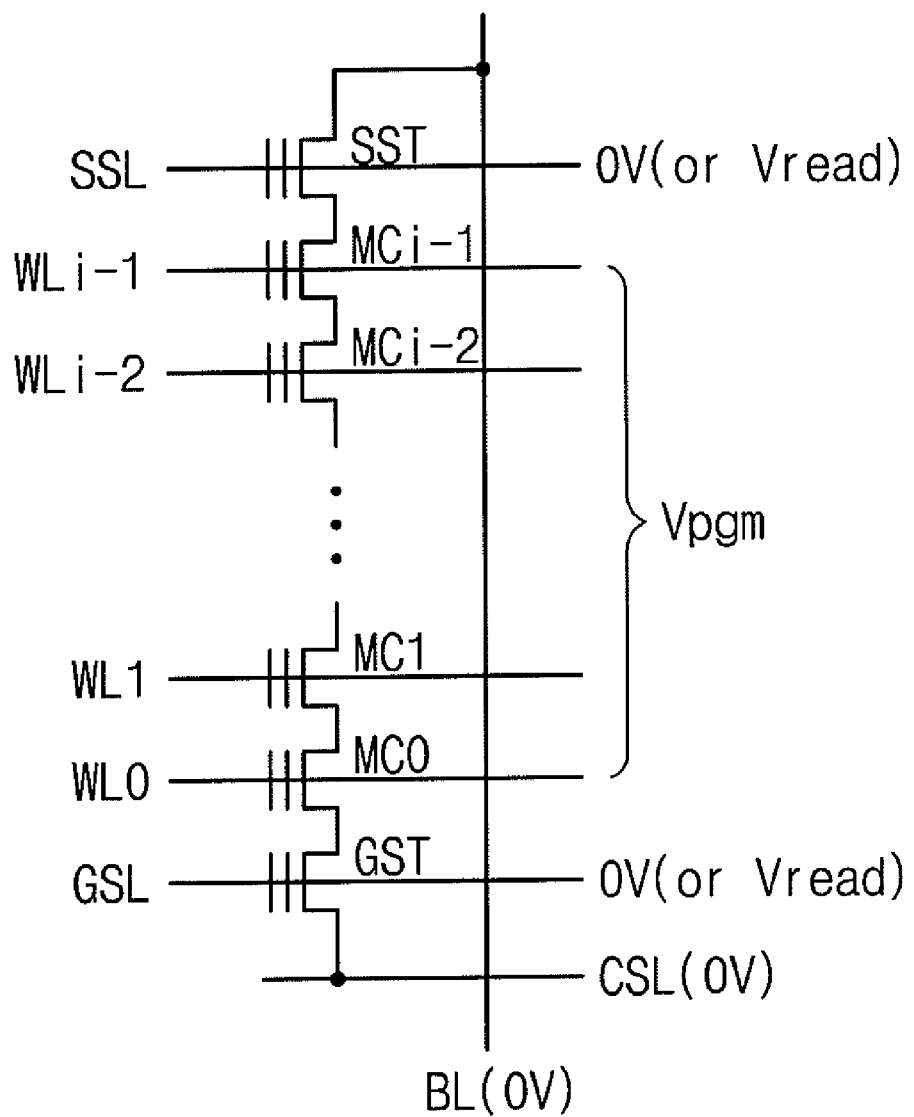
FIG. 6 is a circuit diagram of the NAND cell unit of FIG. 3, with a pulsed voltage Vpgm applied during a "one-pulse programming" of memory cells step S110 of FIG. 4.
Figure 7:
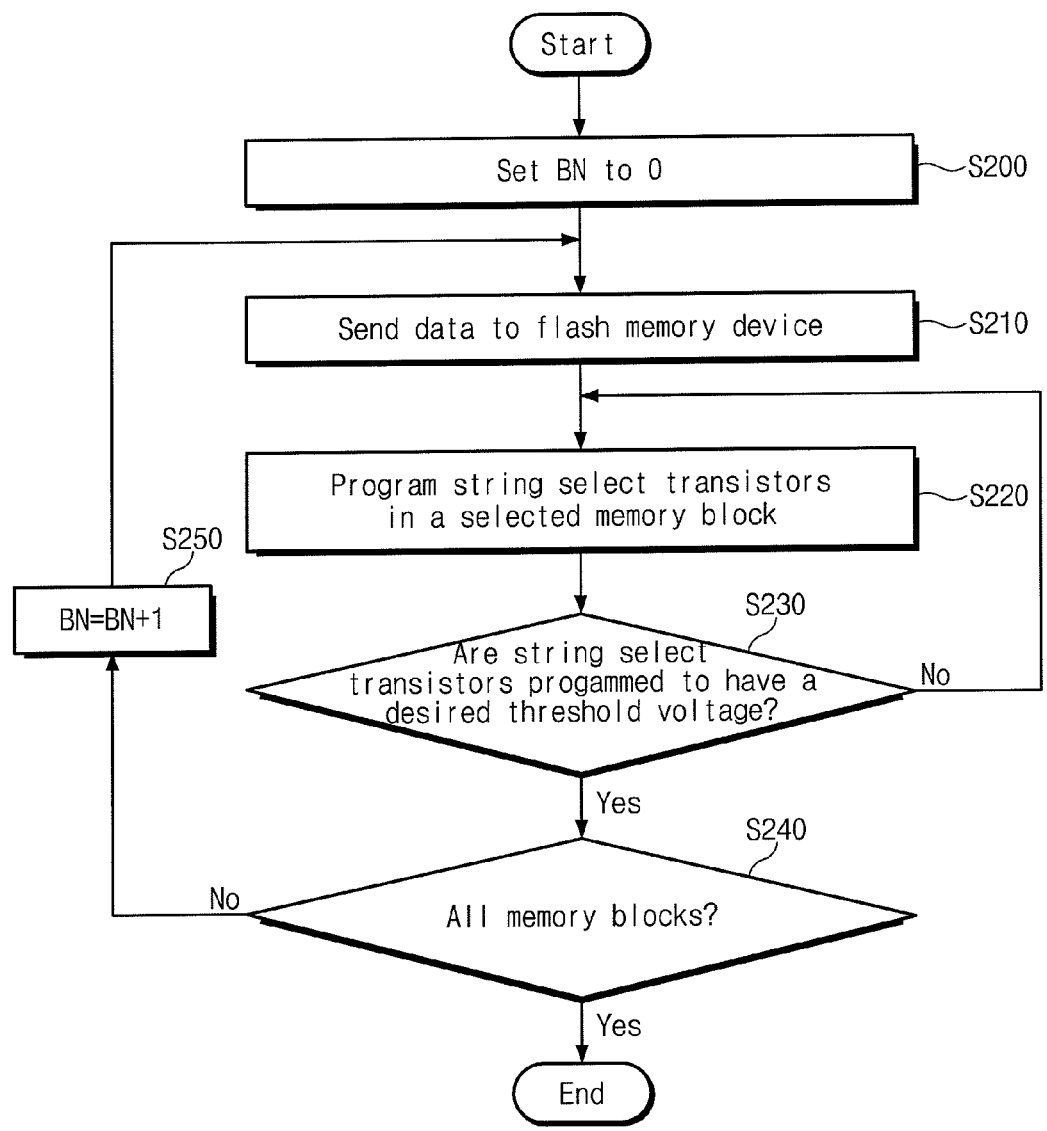
FIG. 7 is a flow chart illustrating a method of performing step S120 of FIG. 4 by incremental step pulse programming (ISPP) of string and/or ground select transistors (SST and/or GST), block by block, in the flash memory device 100 of FIG. 1.

In general, a preferred sequence of operations is to erase all the memory storage cells (memory transistors MC0, MC1, MCi-2, MCi-1) and all the string select transistors (SST) and/or ground select transistors (GST) in all (or a plurality of) memory blocks (MB) S100 (see erase bias voltages applied in FIG. 5); and next to program the memory storage cells in the memory cell array, block by block S110 (see voltages applied in FIG. 6), and finally to program string select transistors (SST) and/or ground select transistors (GST), block by block, in each of the programmed memory blocks S120 (e.g., according to received data and by the method illustrated in FIG. 7).

Figure 5:
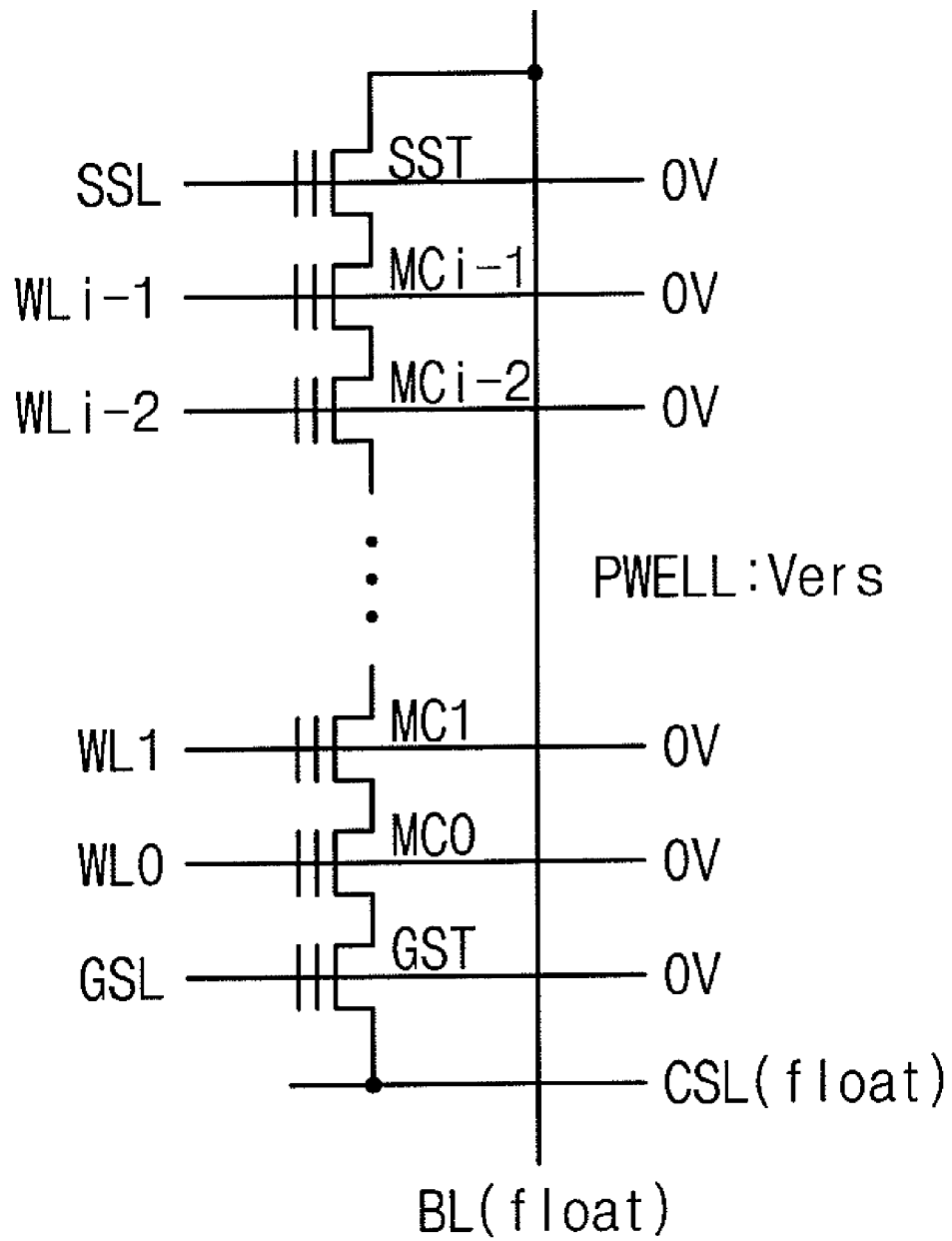
FIG. 5 is a circuit diagram of the NAND cell unit of FIG. 3, with ground voltage applied during the "erase all memory blocks" step S100 of FIG. 4.

FIG. 5 is a circuit diagram of the NAND cell unit of FIG. 3, with ground voltage applied during an "all block erasing" mode of operation. In step S100 of FIG. 4, all the memory cell transistors in a memory block are erased collectively. This is performed by applying a low voltage Vss (e.g., ground, 0 volts) to all the control gate lines (word lines $WL_0$-$WL_{i-1}$) of a selected memory block, while applying a positive boosted voltage (erasing voltage Vers) to a p-type well (PWELL) of the NAND string to cause electrons in the respective floating gates of the memory storage cells (memory transistors MC0, MC1, MCi-2, MCi-1) to discharge into their NAND string channels. Meanwhile, the source line (CSL) and the bit lines (BL0, BL1, BL2 . . . $BL_{j-1}$) are floating. Thus, data in all the memory storage cell (memory transistors MC0, MC1, MCi-2, MCi-1) of the NAND memory block are set to "1" (erased state). These bias conditions may be applied simultaneously to multiple or all memory blocks MB in the memory cell array 110 of the memory device 100, resulting in the bulk erase of multiple or all memory blocks.

During this erase step S100, the low voltage Vss (e.g., ground, 0 volts) is also applied to the string selection lines (SSL), and the ground selection lines (GSL) while the positive boosted voltage (erasing voltage Vers) is applied to the p-type well (PWELL). Thus, the string selection transistor (SST) and the ground selection transistor (GST) that are memory transistors including floating gates, are also erased (set to "1").

FIG. 6 is a circuit diagram of the NAND cell unit of FIG. 3, with a pulsed voltage Vpgm applied during a "one-pulse programming" of memory storage cells in step S110 of FIG. 4.

After step S100 in FIG. 4 of erasing all the data collectively in the respective NAND strings of one or more memory blocks, data writing step S110 may be performed by sequentially writing, with one-pulse per page, into the memory storage cells in the pages of each memory block, starting with the memory storage cells arranged in the page along the control gate line (word line WL0) nearest the source line (CSL). In the case of writing a "0" data into a memory storage cell, when a positive boosted (programming) voltage Vpgm is applied to a selected word line (e.g., WL0), electrons are then injected into a floating gate of the selected memory transistor (e.g., MC0) from the channel of the respective NAND string (so-called "0 write"). In the case of "1" data writing, electron injection is inhibited (so-called "write inhibit" or "1" write).

Data writing into the respective memory storage cells of each NAND string may be performed by controlling the channel potential of a selected memory storage cell depending upon whether data "0" or "1" is to be written therein. For example, in the case of data "0" writing, the channel potential is kept low. Thus, when the write voltage is applied to the control gate of the selected memory storage cell (e.g. MC0), its floating gate is boosted to thereby cause electron injection into the floating gate. In the case of "1" data writing (or write inhibit), the channel potential is boosted to thereby inhibit electron injection into the floating gate.

There are various systems for controlling channel potentials in the case of data writing. A self-boost system is used in which when "1" data is to be written, the channel of a selected memory storage cell is placed in a floating state and the channel potential is boosted by capacitive coupling of the channel to the control gate. More particularly, before the write voltage is applied to the control gate line of a particular memory storage cell (e.g., WL0), Vss or Vdd is applied to its bit line depending upon write data "0" or "1" to turn ON a selected gate transistor (e.g., MC0) on the bit line side and to turn OFF a selected gate transistor on the source side. Thus, when "0" data is to be written, Vss is transferred to the NAND cell channel. When "1" data is to be written, the NAND cell channel is precharged to a potential equal to the voltage (for example, Vdd+.alpha.) applied to the gate of the selected gate transistor minus the threshold voltage of the selected gate transistor to thereby place the NAND cell channel in a floating state.

A Local Self-Boost (LSB) system is also used in which two memory storage cells disposed one on either side of a selected memory storage cell are turned OFF. Thus, only the channel of the selected memory storage cell is placed in a floating state where it is cut off from other memory storage cells to thereby boost the channel of the selected memory storage cell.

FIG. 7 is a flow chart illustrating a method of performing step S120 of FIG. 4. The string select transistors (SST) and/or ground select transistors (GST) are incremental step pulse programmed (ISPP), block by block among the memory blocks (MB) within the memory cell array 110 in the flash memory device 100 of FIG. 1.

Figure 8:
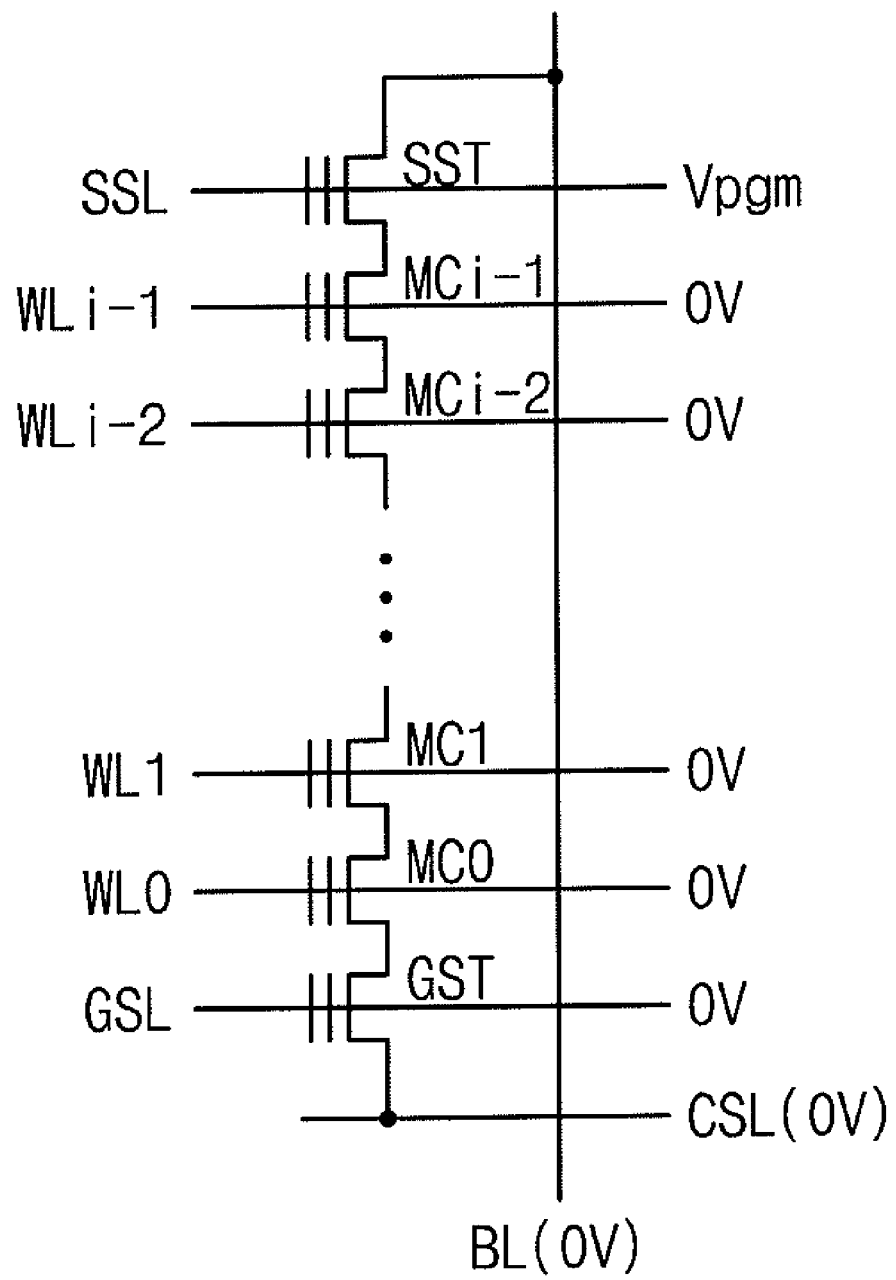
FIG. 8 is a circuit diagram of the NAND cell unit of FIG. 3, illustrating voltages applied in a current memory block (BN) during the "SST programming" step S220 of FIG. 7.

In initialization step S200, the memory block number (counter) BN is initialized to zero. The memory block number (counter) BN is incremented (S250) each time the steps S210, S220, S230 are performed upon the current memory block, until all memory blocks (S240, YES branch) have been processed. In step S210, data not for storage in the memory storage cells (memory transistors MC0, MC1, MCi-2, MCi-1) of the flash memory device 100 of FIG. 1 is received by the flash memory device 100 of FIG. 1. Next, in programming step S220, the string select transistors SST in a current memory block (memory block number BN) are programmed (with "0" or "1" data) by applying the received data and the bias voltages as illustrated in FIG. 8 or 11 (or FIG. 13). Next, in verification step S230, the just-programmed string select transistors SST are read, and it is determined whether the programmed string select transistors SST in the current memory block (memory block number BN) have a proper threshold voltage Vth. If not (NO branch of S230), then the string select transistors SST in a current memory block (memory block number BN) are re-programmed according to the same received data. If the string select transistors SST in a current memory block (memory block number BN) are verified (see FIGS. 9, 10) as having the proper threshold voltage (YES branch of S230), then the memory block number (counter) BN is incremented (S250) and the steps S210, S220, S230 are performed upon the string select transistors SST in the next memory block.

Figure 11:
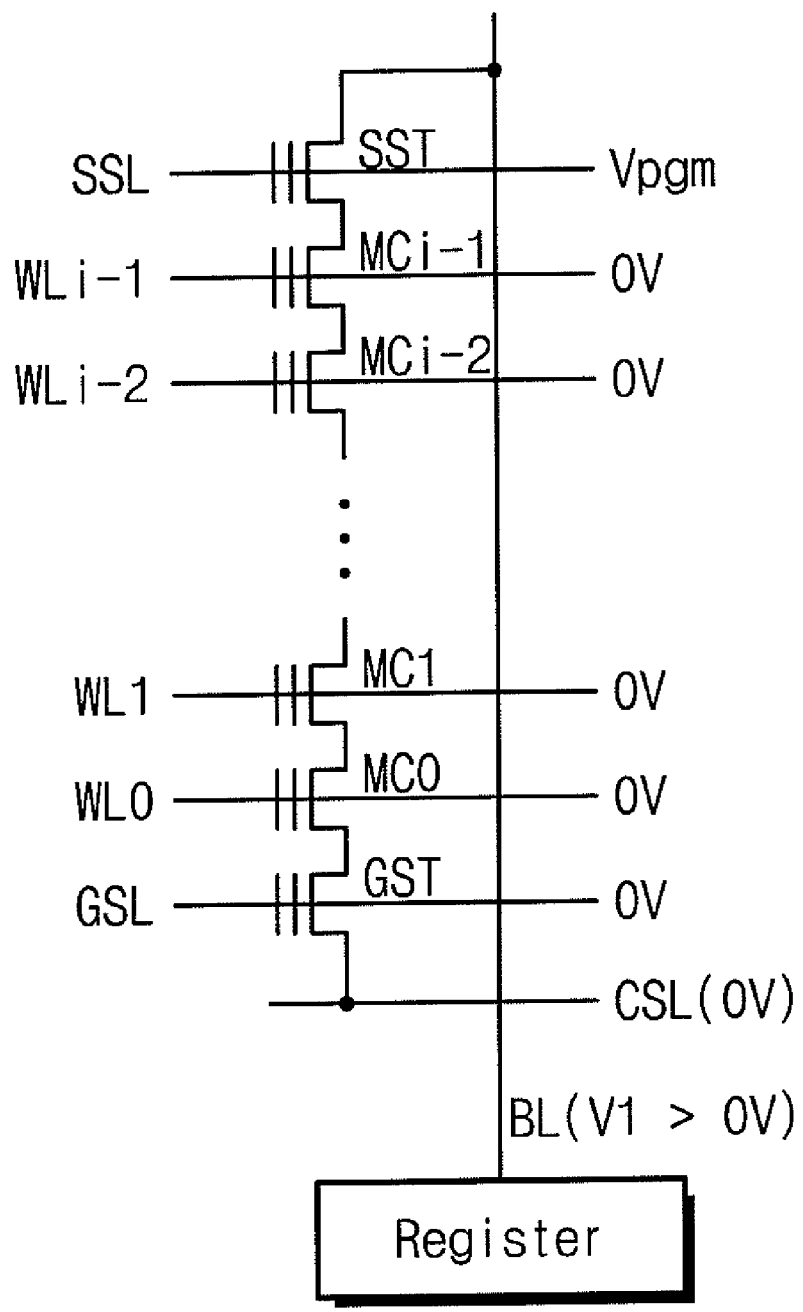
FIG. 11 is a circuit diagram of the NAND cell unit of FIG. 3, illustrating voltages applied during a "SST PGM-inhibit" mode of operation.
Figure 12:
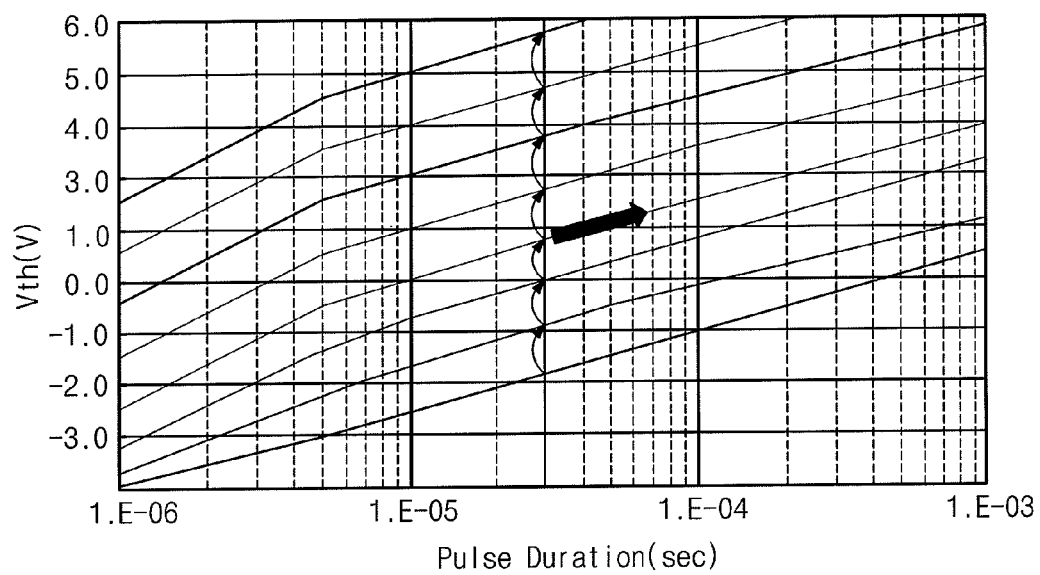
FIG. 12 is a graph illustrating the relationship between Pulse Duration and threshold voltage Vth of the programmable string select transistors SST.

FIG. 8 is a circuit diagram of the NAND cell unit of FIG. 3, illustrating voltages applied in a current memory block (BN) during an "SST programming" step S220 of FIG. 7. The string select transistors SST in each block can store binary data, (e.g., "program" data "0" involving a high threshold voltage representing that electrons have been injected into the floating gate from a channel thereof, and "erase" or "inhibit" data "1" involving a low threshold voltage representing that electrons have been discharged from the floating gate to the channel) and are programmed by applying the received data and the bias voltages as illustrated in FIGS. 8, 11, 12.

During the "SST programming" step S220 of FIG. 7, a ground voltage (0V) is applied to all the control gate lines (e.g., word lines $WL_0$-$WL_{i-1}$), and to the control gate/line (GSL) of the ground select transistor (GST), and the ground voltage (0V) is applied to the bit line BL and to the source line CSL. The program voltage Vpgm is applied to the string select line SSL and to the control gates of all string select transistors SST in the memory block. Thus all string select transistors SST in the current memory block may be programmed to have a desired threshold voltage Vth, e.g., with "0" data stored therein.

Figure 9:
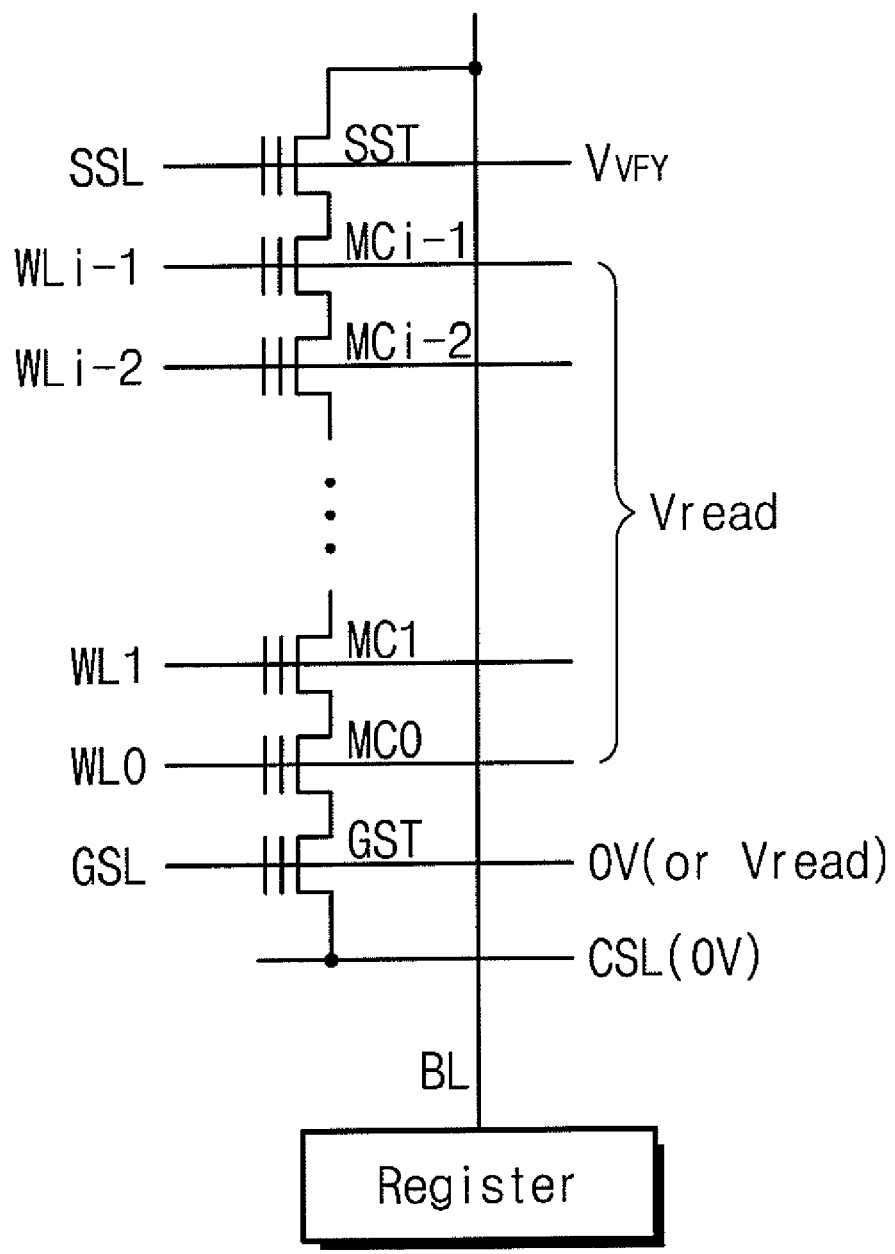
FIG. 9 is a circuit diagram of the NAND cell unit of FIG. 3, illustrating voltages applied in a current memory block (BN) during the "verify SST Vth" step S230 of FIG. 7.

FIG. 9 is a circuit diagram of the NAND cell unit of FIG. 3, illustrating voltages applied in a current memory block (BN) during the "verify SST Vth" step S230 of FIG. 7.

During the "verify SST Vth" step S230 of FIG. 7, a verify-voltage $V_{VFY}$ is applied to the string select line SSL and to the control gates of all string select transistors SST in the current memory block BN. Meanwhile, the ground voltage (0V) is applied to the source line CSL at the other end of the NAND string, and a ground voltage (0V) or read-enabling voltage Vread is applied to the control gates of all the memory storage cells (memory transistors MC0, MC1, MCi-2, MCi-1) and to the control gate/line (GSL) of the ground select transistor (GST). If the actual programmed threshold voltage Vth of the string select transistors SST in the current memory block BN is less than the applied verify-voltage $V_{VFY}$ then the voltage output on the bitline BL may be set to ground (0V), and the verification may fail ("NO" branch of step S230 of FIG. 7). If the actual programmed threshold voltage Vth of the string select transistors SST in the current memory block BN is greater than applied verify-voltage $V_{VFY}$ then the voltage produced on the bitline BL may remain at the high voltage Vcc, and the verification may pass ("YES" branch of step S230 of FIG. 7).

FIG. 12 is a graph illustrating the relationship between Pulse Duration and threshold voltage Vth of the programmable string select transistors SST. As illustrated in FIG. 12, the programmed threshold voltage Vth of the programmable string select transistors SST can be incrementally increased (see vertical curved arrows) by repeating a pulsed programming voltage Vpgm as indicated by the repeatable programming step S220 in FIG. 7. Thus, if in step S230 of FIG. 7 actual programmed threshold voltage Vth of the string select transistors SST in the current memory block BN is less than the applied verify-voltage $V_{VFY}$ and the verification fails ("NO" branch of step S230 of FIG. 7), the pulse of the programming step S220 of FIG. 7 may be repeated until the actual threshold voltage is incrementally increased to a value high enough that the programmable string select transistors SST passes ("NO" branch of step S230 of FIG. 7) the verification step S230 of FIG. 7.

Figure 10:
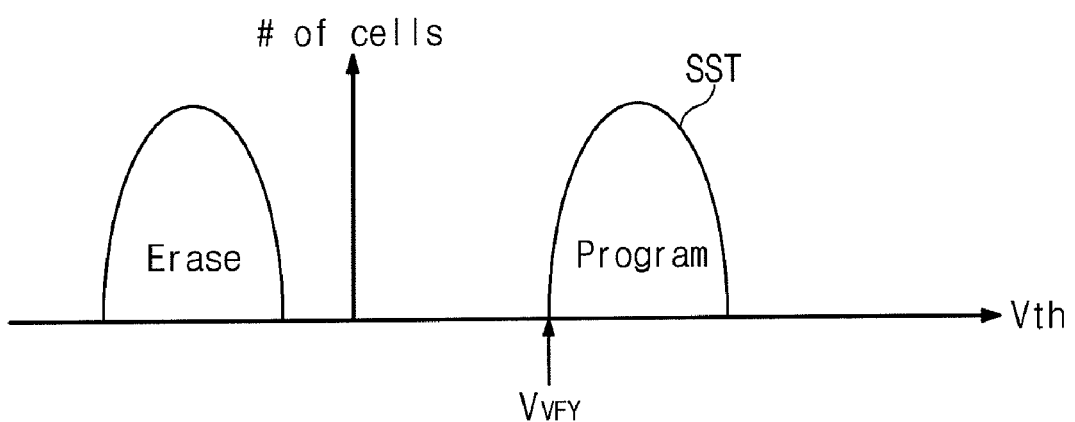
FIG. 10 is a graph of the distribution of verified threshold voltages Vth in the programmable string select transistors SST in the NAND flash memory of FIG. 3, and their data contents when recording 1-bit (binary) data.

FIG. 10 is a graph of the distribution of verified programmed threshold voltages Vth of the programmable string select transistor SST in the NAND flash memory of FIG. 3, and their data contents when recording 1-bit (binary) data having two values ("erase/inhibit" and "program"). In FIG. 10, the abscissa indicates the actual threshold voltages Vth and the ordinate indicates the distribution frequency of memory transistors at the threshold voltage Vth. As indicated in FIG. 10, following a verification step (FIG. 9 and step S230 of FIG. 7), all programmed threshold voltages Vth of programmable string select transistor SST are greater than the verify-voltage $V_{VFY}$ (FIG. 9 and step and "YES" branch of step S230 of FIG. 7). If all programmable string select transistor SST in a memory block are programmed, then all such programmable string select transistor SST have a desired threshold voltage Vth.

FIG. 11 is a circuit diagram of the NAND cell unit of FIG. 3, illustrating voltages applied during a "SST PGM-inhibit" mode of operation. As previously noted, random data can be stored in the programmable string select transistor SSTs. Thus, a user may desire to store (leave) "1" (erase/inhibit) data in programmable string select transistor SSTs. The erase" or "inhibit" data "1" is indicated by a low threshold voltage Vth representing that electrons have been discharged from the floating gate to the channel).

During the "SST PGM inhibit" mode of operation, a ground voltage (0V) is applied to all the control gate lines (e.g., word lines $WL_0$-$WL_{i-1}$), and to the control gate/line (GSL) of the ground select transistor (GST), and the ground voltage (0V) is applied to the source line CSL. However, a voltage V1 indicating data "1" is applied to the bit line BL, and V1 is greater than the ground voltage (0V). The voltage of V1 may be applied without changing of register. Meanwhile, the program voltage Vpgm is applied to the string select line SSL and to the control gates of all string select transistors SST in the memory block. Thus all the string select transistors SST in the current memory block may be simultaneously and randomly programmed or inhibited to have a desired threshold voltage Vth, e.g., a high Vth in SSTs with "0" data stored therein (see FIG. 8), or a low Vth in SSTs with "1" data stored therein (FIG. 11).

Referring again to FIG. 12, at the bias conditions of FIG. 11 and FIG. 8, the threshold voltage Vth of an unselected (inhibit) string select transistor SST is slightly increased, and the threshold voltage Vth of selected (programmed) string select transistor SST is steeply increased. If the register is changed, the voltage of V1 may high enough (2V~3V) to prevent Fowler-Nordheim (FN) tunneling through tunnel barrier of the string select transistor SST. The tunnel barrier layer may comprise $SiO_2$, SiON, SiN, $Al_2O_3$, $HfO_2$, HfSiON, and $ZrO_2$.

Figure 13:
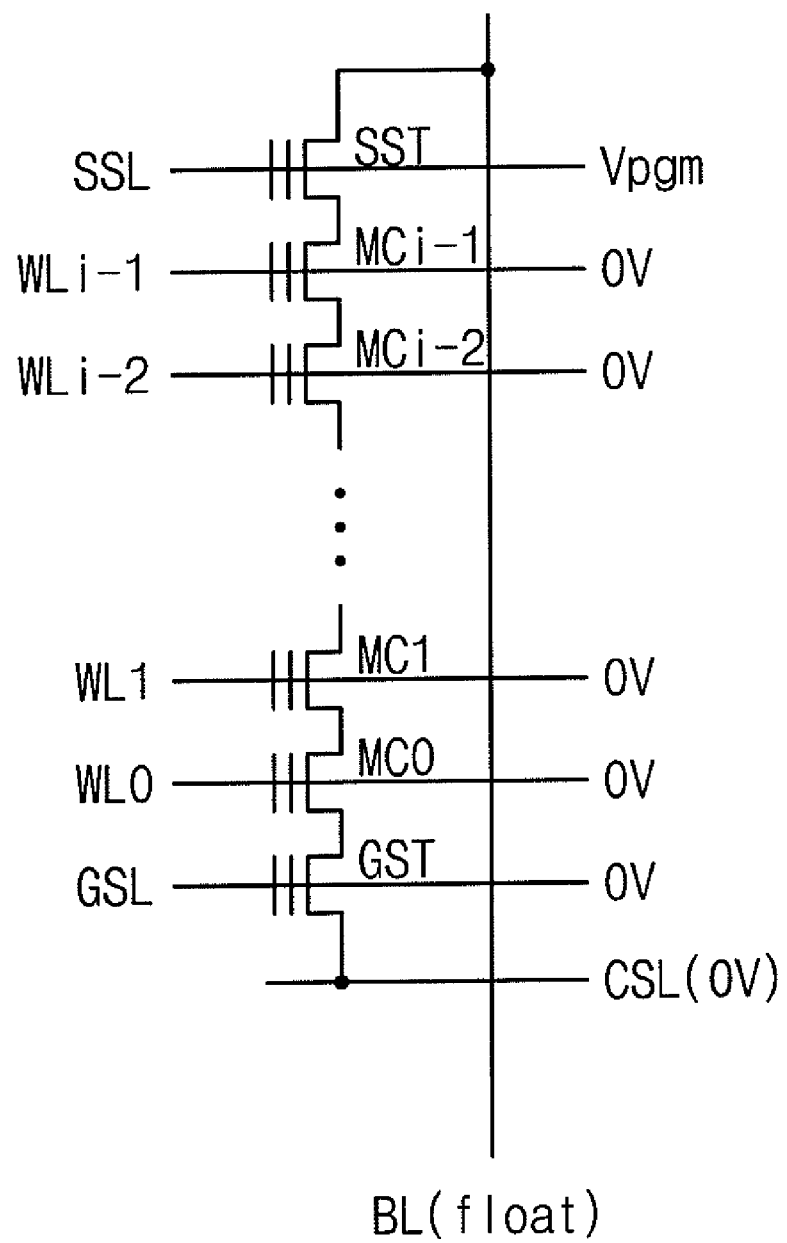
FIG. 13 is a circuit diagram of the NAND cell unit of FIG. 3, illustrating voltages applied during another "SST PGM-inhibit" mode of operation.

FIG. 13 is a circuit diagram of the NAND cell unit of FIG. 3, illustrating voltages applied during another "SST PGM-inhibit" mode of operation. The voltages applied in this case are the same as applied in FIG. 11 except that the bit line BL is floating instead of being held to a fixed voltage V1. If the capacitance of the bit line is small enough, the bit line BL may be capacitatively coupled to the voltage of Vpgm.

Figure 14:
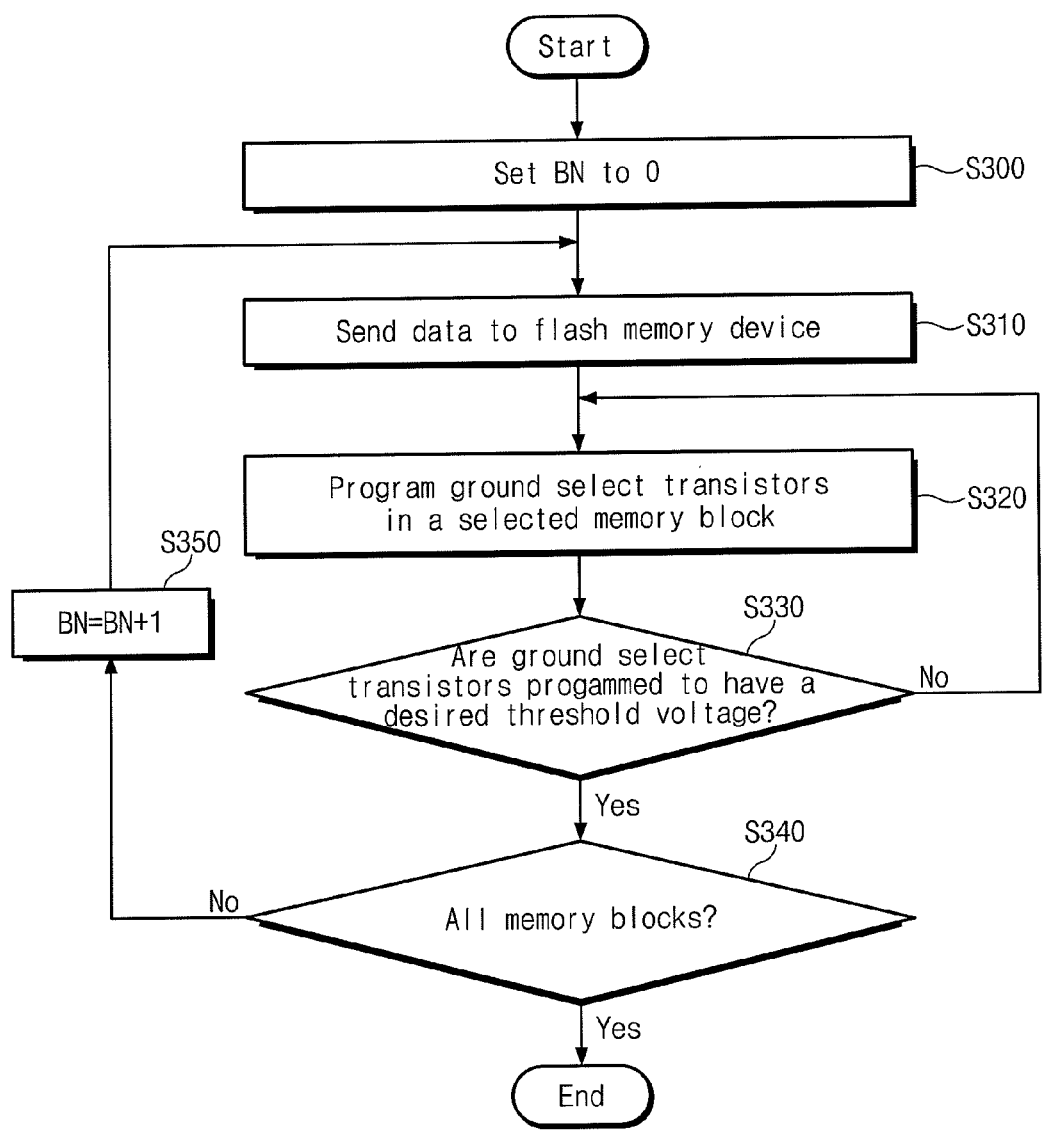
FIG. 14 is a flow chart illustrating a method of incremental step pulse programming (ISPP) of ground select transistors GST in the NAND cell unit of FIG. 3, block by block, in the memory blocks (MB) within the memory cell array 110 in the flash memory device 100 of FIG. 1.

FIG. 14 is a flow chart illustrating a method of incremental step pulse programming (ISPP) of ground select transistors GSL in the NAND cell unit of FIG. 3, block by block, in the memory blocks (MB) within the memory cell array 110 in the flash memory device 100 of FIG. 1. The method of incremental step pulse programming (ISPP) of programmable ground select transistors GST of FIG. 14 is similar or the same as method of incremental step pulse programming (ISPP) of programmable string select transistors SST of FIG. 7.

The ground select transistors GST are incremental step pulse programmed (ISPP), block by block among the memory blocks (MB) within the memory cell array 110 in the flash memory device 100 of FIG. 1.

Figure 15:
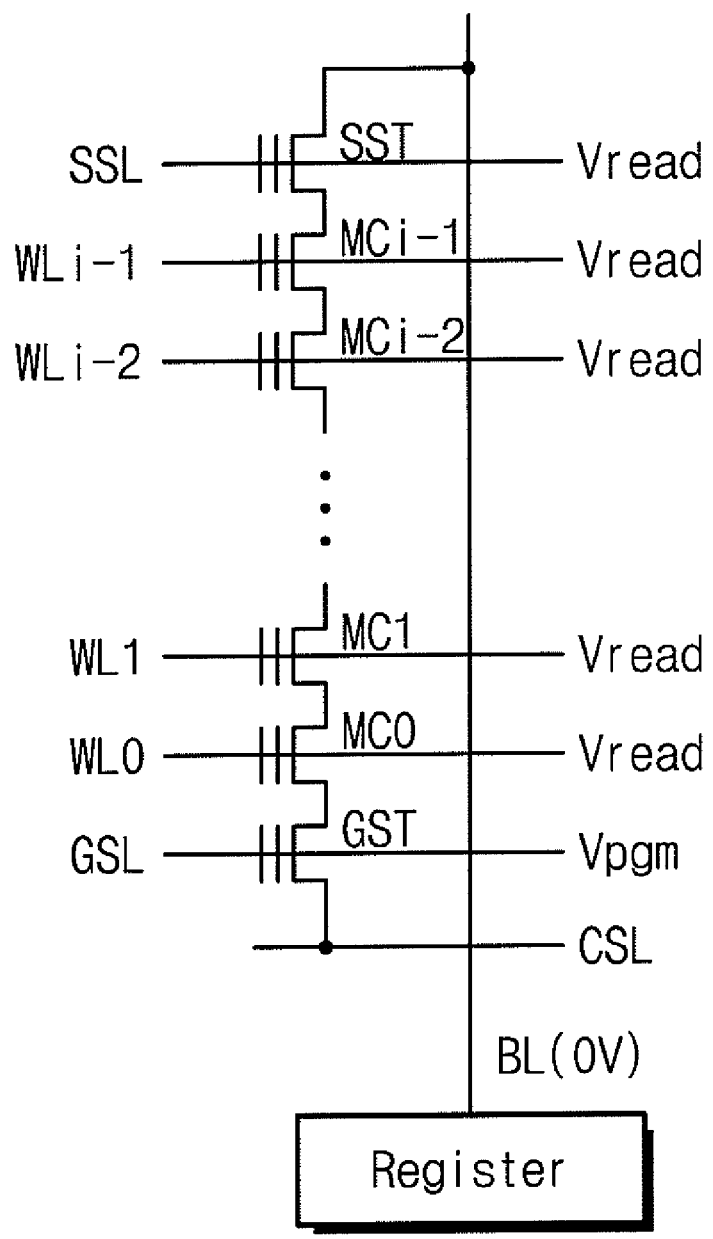
FIG. 15 is a circuit diagram of the NAND cell unit of FIG. 3, illustrating voltages applied during the "GST programming" step S320 of FIG. 14 to write a data "0"
Figure 17:
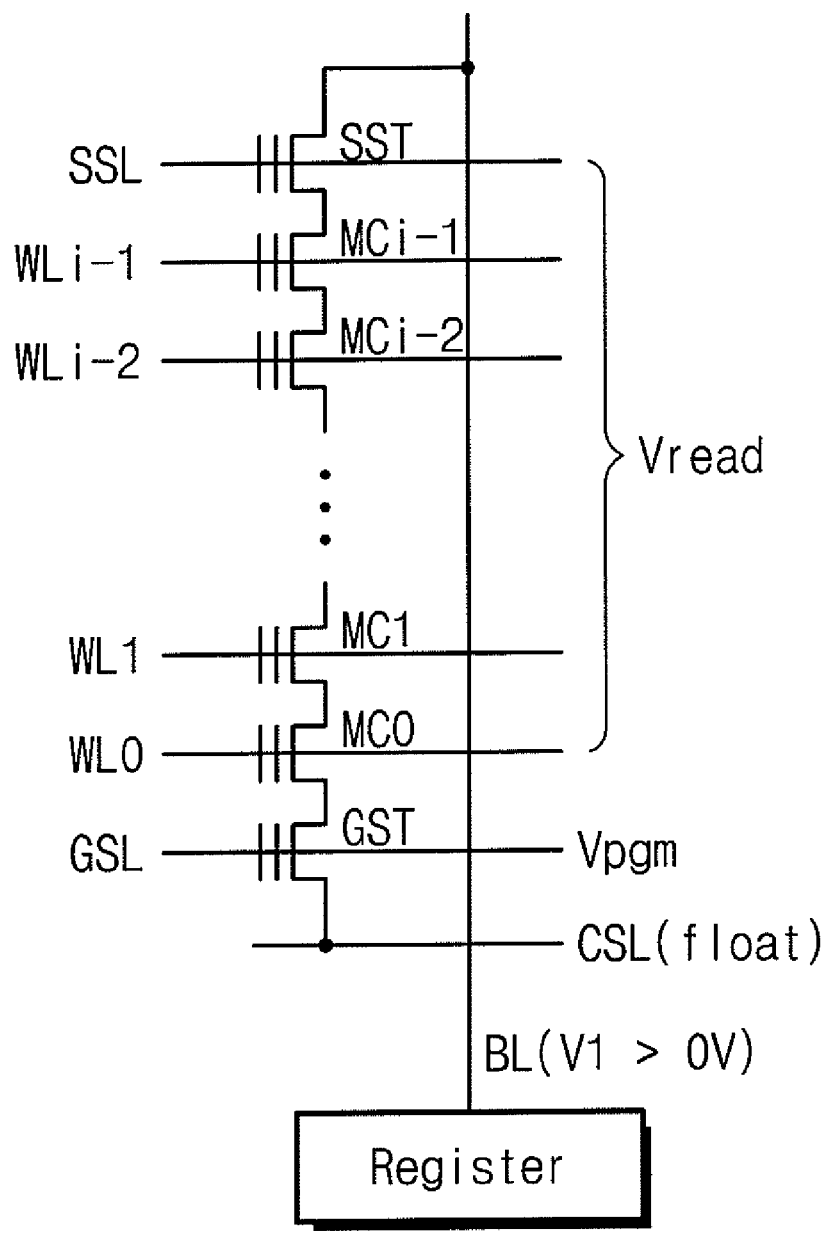
FIG. 17 is a circuit diagram of the NAND cell unit of FIG. 3, illustrating voltages applied during a "GST PGM-inhibit" mode of operation to write a data "1"

The ground select transistors GST in each block are able to store binary data, (i.e., "program" data "0" involving a high threshold voltage representing that electrons have been injected into the floating gate from a channel thereof, and "erase" or "inhibit" data "1" involving a low threshold voltage representing that electrons have been discharged from the floating gate to the channel) and are programmed by applying the received data and the bias voltages as illustrated in FIGS. 15 and 17.

In initialization step S300, the memory block number (counter) BN is initialized to zero. The memory block number (counter) BN is incremented (S350) each time the steps S310, S320, S330 are performed upon the current memory block, until all memory blocks (S340, YES branch) have been processed. In step S310, data not for storage in the memory storage cells (memory transistors MC0, MC1, MCi-2, MCi-1) of the flash memory device 100 of FIG. 1 is received by the flash memory device 100 of FIG. 1. Next, in programming step S320, the ground select transistors GST in a current memory block (memory block number BN) are programmed (with "0" or "1" data) by applying the received data and the bias voltages as illustrated in FIG. 15 or 17. Next, in verification step S330, the just-programmed ground select transistors GST are read, and it is determined whether the programmed ground select transistors GST in the current memory block (memory block number BN) have a proper threshold voltage Vth. If not (NO branch of S330), then the ground select transistors GST in a current memory block (memory block number BN) are re-programmed according to the same received data. If the ground select transistors GST in a current memory block (memory block number BN) are verified (see FIG. 16) as having the proper threshold voltage (YES branch of S330), then the memory block number (counter) BN is incremented (S350) and the steps S310, S320, S330 are performed upon the ground select transistors GST in the next memory block.

FIG. 15 is a circuit diagram of the NAND cell unit of FIG. 3, illustrating voltages applied during the "GST programming" step S320 of FIG. 14 to write a data "0". During the "GST programming" step S320 of FIG. 14, a read-enabling voltage (Vread or Vpass) is applied to all the control gate lines (e.g., word lines WL0-WLi-1), and the ground voltage (0V) is applied to the bit line BL. The program voltage Vpgm is applied to the ground select line GSL and to the control gates of all ground select transistors GST in the memory block. Thus all ground select transistors GST in the current memory block may be programmed to have a desired threshold voltage Vth, e.g., with "0" data stored therein.

Figure 16:
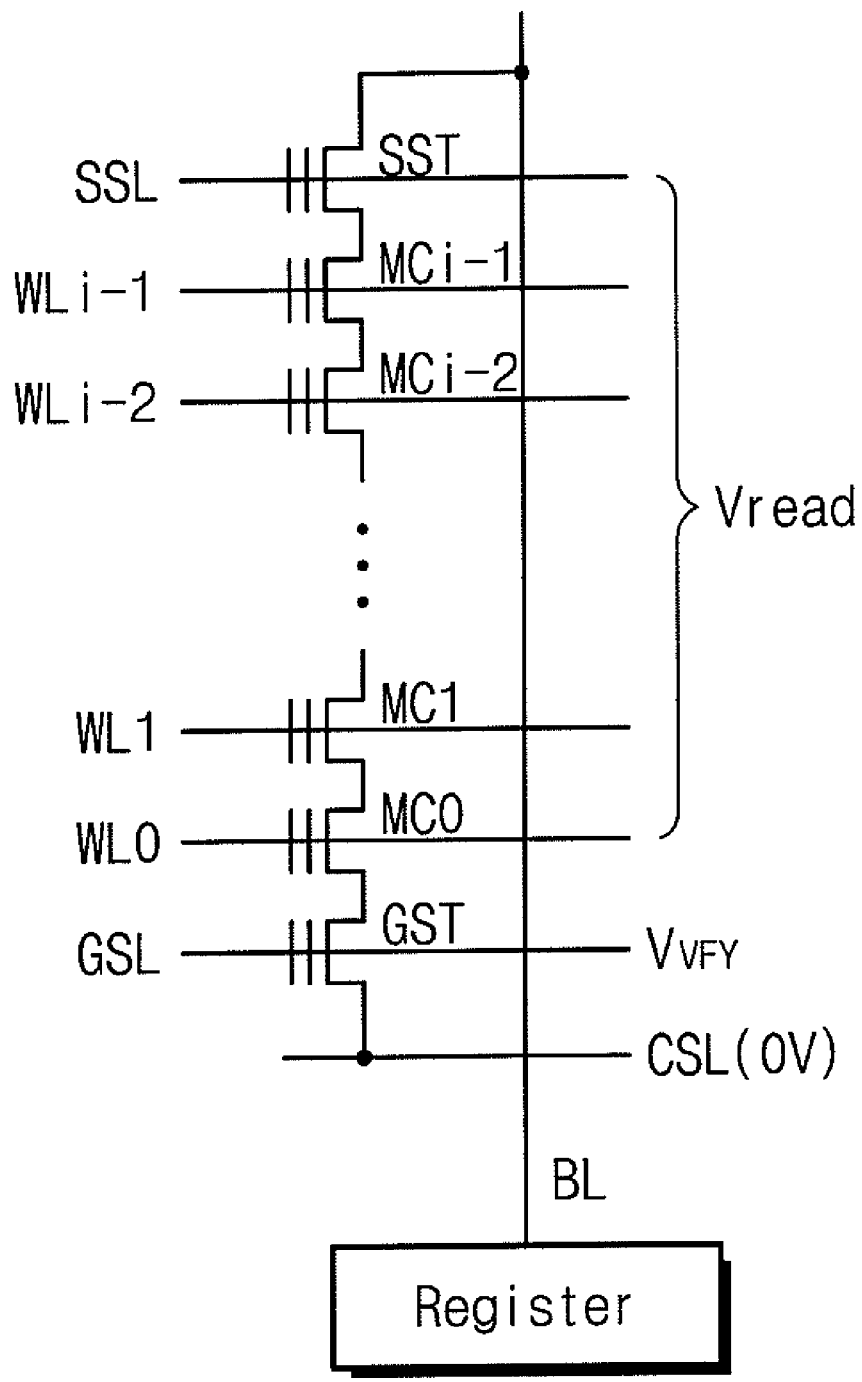
FIG. 16 is a circuit diagram of the NAND cell unit of FIG. 3, illustrating voltages applied during the "verify GST Vth" step 330 of FIG. 14.

FIG. 16 is a circuit diagram of the NAND cell unit of FIG. 3, illustrating voltages applied during a "verify GST Vth" step 330 of FIG. 14.

During the "verify SST Vth" step S330 of FIG. 14, a verify-voltage $V_{VFY}$ is applied to the ground select line GSL and to the control gates of all ground select transistors GST in the current memory block BN. Meanwhile, the ground voltage (0V) is applied to the source line CSL, and a read-enabling voltage Vread (e.g., ground voltage, 0V) or is applied to the control gates of all the memory storage cells (memory transistors MC0, MC1, MCi-2, MCi-1) and to the control gate/line (SSL) of the string select transistor (SST). If the actual programmed threshold voltage Vth of the ground select transistor GST in the current memory block BN is less than the applied verify-voltage $V_{VFY}$ then the voltage output on the bitline BL to the register may be set to ground (0V), and the verification may fail ("NO" branch of step S330 of FIG. 14). If the actual programmed threshold voltage Vth of the ground select transistor GST in the current memory block BN is greater than applied verify-voltage $V_{VFY}$ then the voltage produced on the bitline BL may remain at the high voltage Vcc, and the verification may pass ("YES" branch of step S330 of FIG. 14).

FIG. 17 is a circuit diagram of the NAND cell unit of FIG. 3, illustrating voltages applied during a "GST PGM-inhibit" mode of operation. As previously noted, random data can be stored in the programmable string select transistor GST. Thus, a user may desire to store (leave) "1" (erase/inhibit) data in programmable ground select transistor GSTs. During the "GST PGM-inhibit" mode of operation, a read-enabling voltage Vread (e.g., ground voltage (0V)) is applied to all the control gate lines (e.g., word lines $WL_0$-$WL_{i-1}$), and to the control gate/line (SSL) of the string select transistor SST, and the source line CSL may float. However, a voltage V1 indicating data "1" is applied to the bit line BL, and V1 is greater than the ground voltage (0V). The voltage of V1 may be applied without changing of register. Meanwhile, the program voltage Vpgm is applied to the ground select line GSL and to the control gates of all ground select transistors GST in the current memory block BN. Thus all the ground select transistors GST in the current memory block may be simultaneously and randomly programmed ("0" write) or inhibited ("1" write) to have a desired threshold voltage Vth, e.g., a high Vth in GSTs with "0" data stored therein (see FIG. 8), or a low Vth in GSTs with "1" data stored therein (see FIG. 12).

Figure 18:
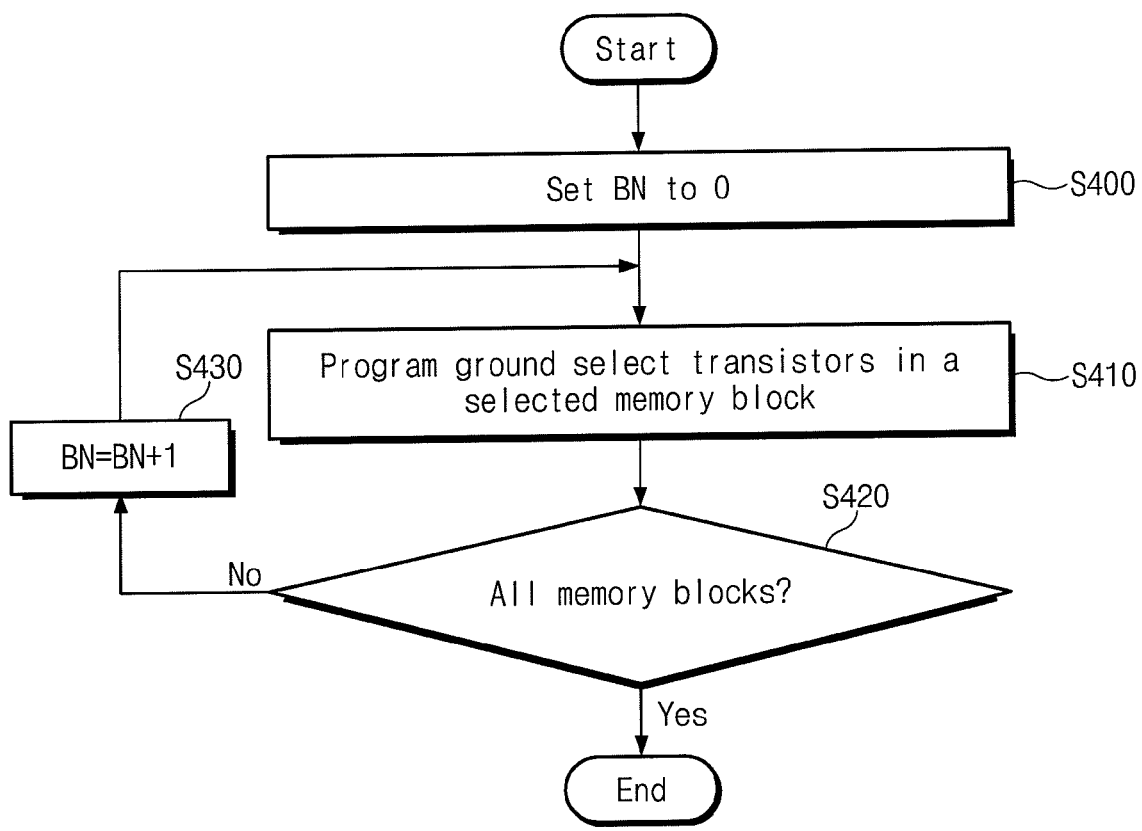
FIG. 18 is a flow chart illustrating a method of incremental step pulse programming (ISPP) of ground select transistors GSL in the NAND cell unit of FIG. 3, block by block, in the memory blocks (MB) within the memory cell array 110 in the flash memory device 100 of FIG. 1.
Figure 23:
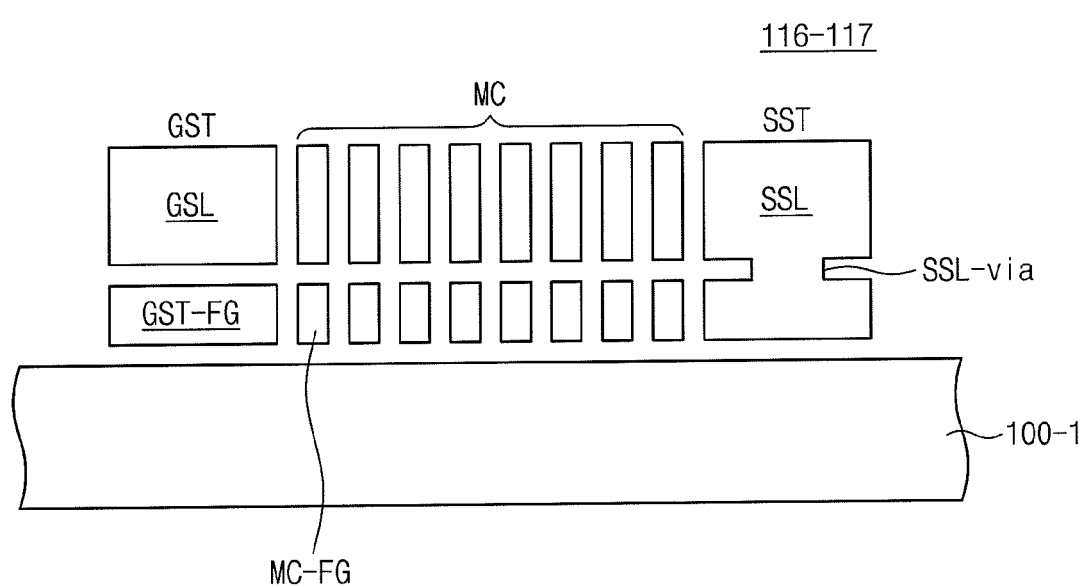
FIG. 23 is a side cross-sectional view of a NAND cell unit 111" in an integrated circuit according to the another embodiment of the present invention, along section line 116-117 in FIG. 22.

FIG. 18 is a flow chart illustrating a method of incremental step pulse programming (ISPP) of ground select transistors GSL in the NAND cell unit of FIG. 3 or FIG. 23, block by block, in the memory blocks (MB) within the memory cell array 110 in the flash memory device 100 of FIG. 1. Each of the string select transistors GSL in FIG. 3 and FIG. 23 is able to store binary data. Before data writing, data stored in all the memory storage cells (memory transistors MC0, MC1, MCi-2, MCi-1) of the memory block are beforehand erased collectively (see erase bias voltages applied in FIG. 5).

In initialization step S400, the memory block number (counter) BN is initialized to zero. The memory block number (counter) BN is incremented (S430) each time the programming step S410 is performed upon the ground select transistors GST of the current memory block BN, until all memory blocks (S420, YES branch) have been processed. In programming step S410, the ground select transistors (GST) in the current block BN are programmed.

Figure 19:
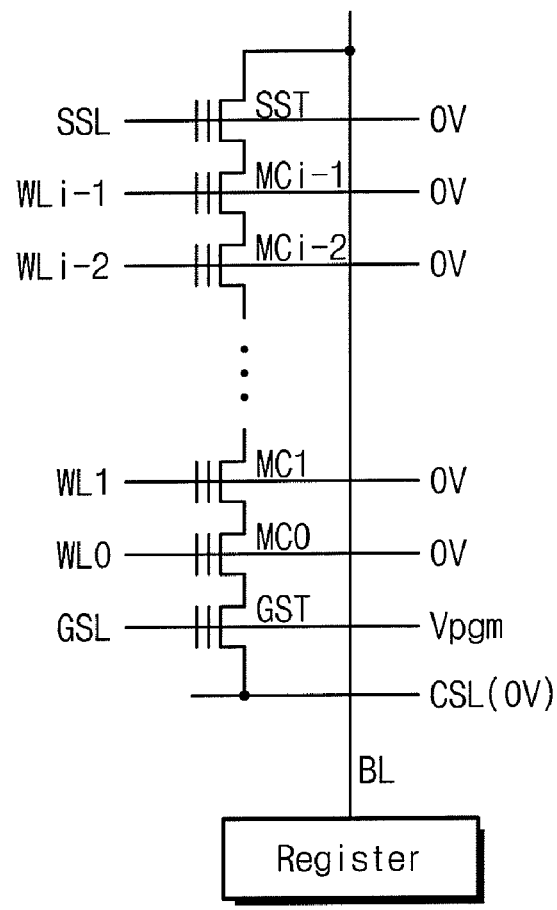
FIG. 19 is a circuit diagram of the NAND cell unit of FIG. 3, illustrating voltages applied for "one pulse" programming of ground select transistors GST during step S410 of FIG. 18.

FIG. 19 is a circuit diagram of the NAND cell unit of FIG. 3, illustrating voltages applied for "one pulse" or "ISPP" programming without PGM inhibit of ground select transistors GST during step S410 of FIG. 18. The ground select transistors GST in each block may be "one pulse" or "ISPP" programmed ("0" write) without PGM inhibit by applying the bias voltages as illustrated in FIG. 19.

During a "one-pulse" GST programming during step S410 of FIG. 18, a ground voltage (0V) is applied to all the control gate lines (e.g., word lines WL0-WLi-1), and to the control gate/line (GSL) of the string select transistor (SST), and the ground voltage (0V) is applied to the source line CSL. The program voltage Vpgm is applied to the ground select line GSL and to the control gates of all ground select transistors GST in the memory block. Thus all ground select transistors GST in the current memory block may be programmed to have a desired threshold voltage Vth, e.g., with "0" data stored therein.

Figure 20:
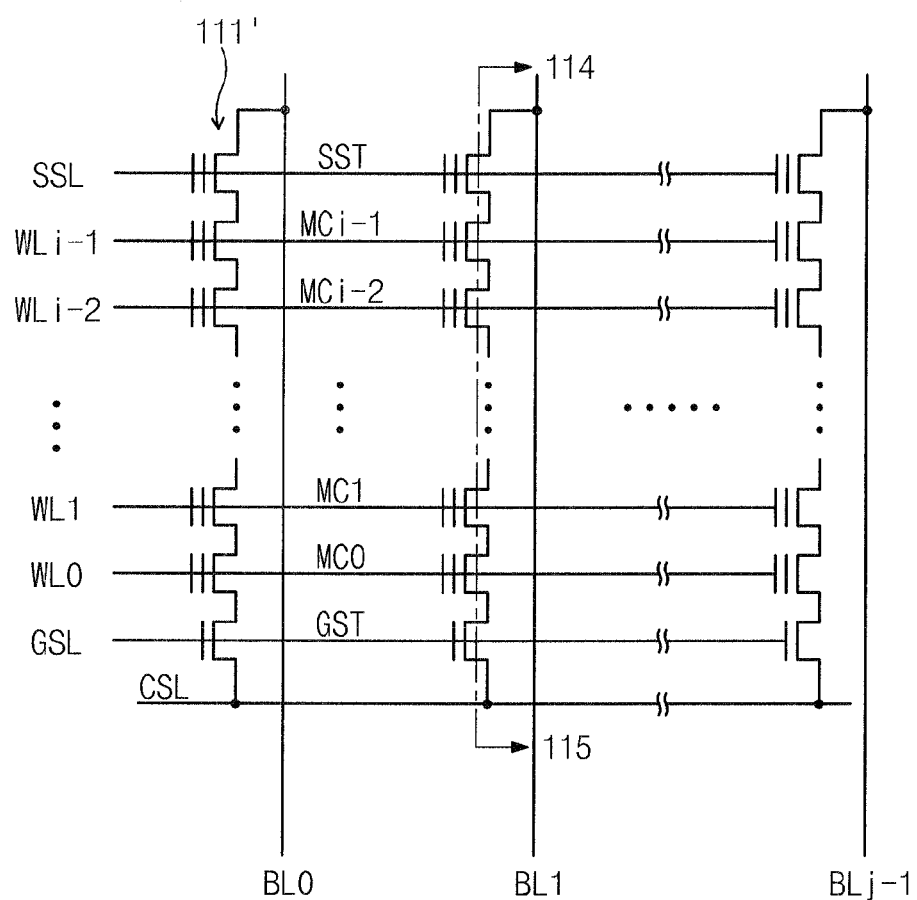
FIG. 20 is circuit diagram of a memory block comprising a NAND cell unit 111' having a programmable string select transistor SST and a non-programmable ground select transistor SST according to an exemplary embodiment of the present invention.

FIG. 20 is circuit diagram of a memory block comprising a NAND cell unit having a programmable string select transistor SST and a non-programmable ground select transistor SST according to an embodiment of the present invention.

Figure 21:
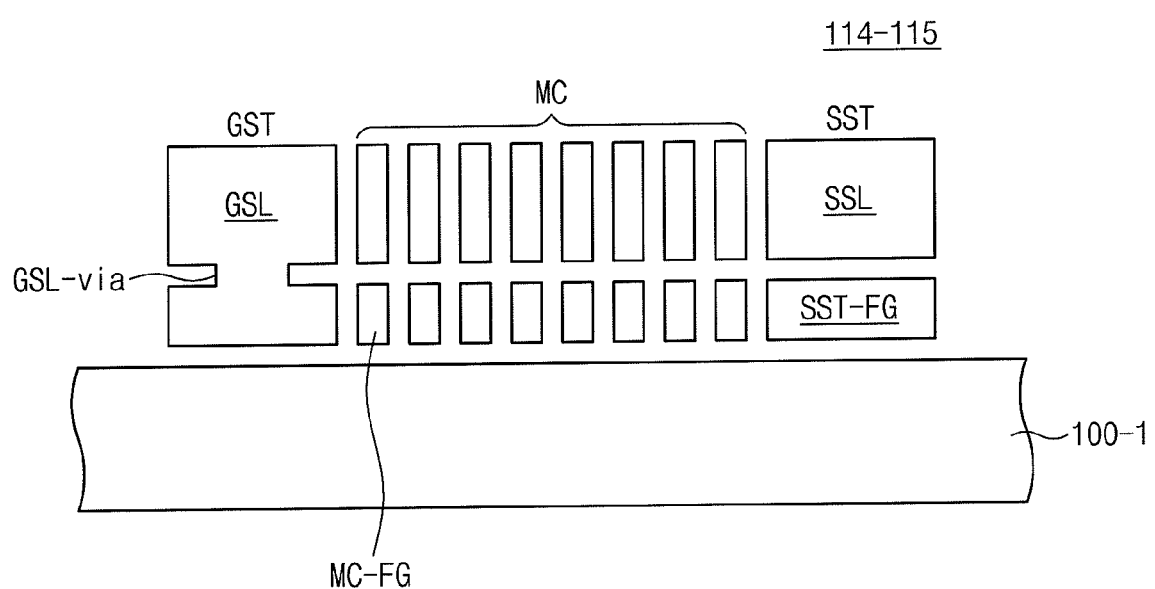
FIG. 21 is a side cross-sectional view of a NAND cell unit 111' in an integrated circuit according to the embodiment of the present invention of FIG. 20, along section line 114-115.

Referring to FIG. 1 and FIG. 21, in a memory cell array 110, NAND cell units 111' are arranged in row and column directions in a matrix form, and connected to control gate lines (e.g., word lines $WL_0$-$WL_{i-1}$), bit lines (BL0, BL1, BL2 ... $BL_{j-1}$), string and ground selection lines (SSL, GSL), and source lines (CSL). Selected ones of the control gate lines ($WL_0$-$WL_{i-1}$) and selection gate lines (SSL, GSL), in the memory cell array 110 are selected during erase, programming, verification, and read operations.

The memory storage cells (MC0, MC1, MCi-2, MCi-1) may be memory transistors of the floating gate type, and in that case the string selection transistors SST may also be memory transistors of the floating gate type and so there is no butting contact between the control gate and the floating gate in the selection transistors SST. However, in this second embodiment of the invention, and the ground selection transistors GST are not memory transistors and are not programmable. Thus, as shown in FIG. 21 there may be provided a butting contact GSL-via between the control gate and the dummy floating gate of each ground selection transistor GST.

FIG. 21 is a side cross-sectional view of a NAND cell unit in an integrated circuit according to the present embodiment of the present invention, along section line 114-115 in FIG. 20. The NAND cell unit 111' of FIG. 20 is formed on a semiconductor substrate 100-1. The channel of the NAND cell unit 111' is formed in the semiconductor substrate 100-1 between the selection transistors SST and GST. The channel of the NAND cell unit 111' may be isolated from channels of other adjacent NAND cell units by shallow trench isolation (STI) (not shown), that prevents electrical current leakage between adjacent semiconductor device components. In this exemplary embodiment, only the string selection transistor SST and not the ground select transistor GST are memory transistors. Thus, only the string selection transistor SST has both a control gate (SSL) and a floating gate (SST-FG). And, the ground selection transistor GST has a control gate (GSL) connected to a dummy floating gate (GST-FG) by a butting contact GSL-via, and the dummy floating gate functions as the control gate of the ground selection transistor GST.

The memory storage cells MC (MC0, MC1, MCi-2, MCi-1) may be memory transistors of the floating gate type, and in that case the string selection transistors SST may be memory transistors of the floating gate type and there is no butting contact between the control gates (SSL) and the floating gates (SST-FG) of each string selection transistors SST.

In accordance with an exemplary embodiment of the invention, the string selection transistors SST are programmable memory transistors, and the gate lengths of the control gates of string selection transistors SST may be the same as the gate length of the control gates of the memory storage cells MC (MC0, MC1, MCi-2, MCi-1).

Figure 22:
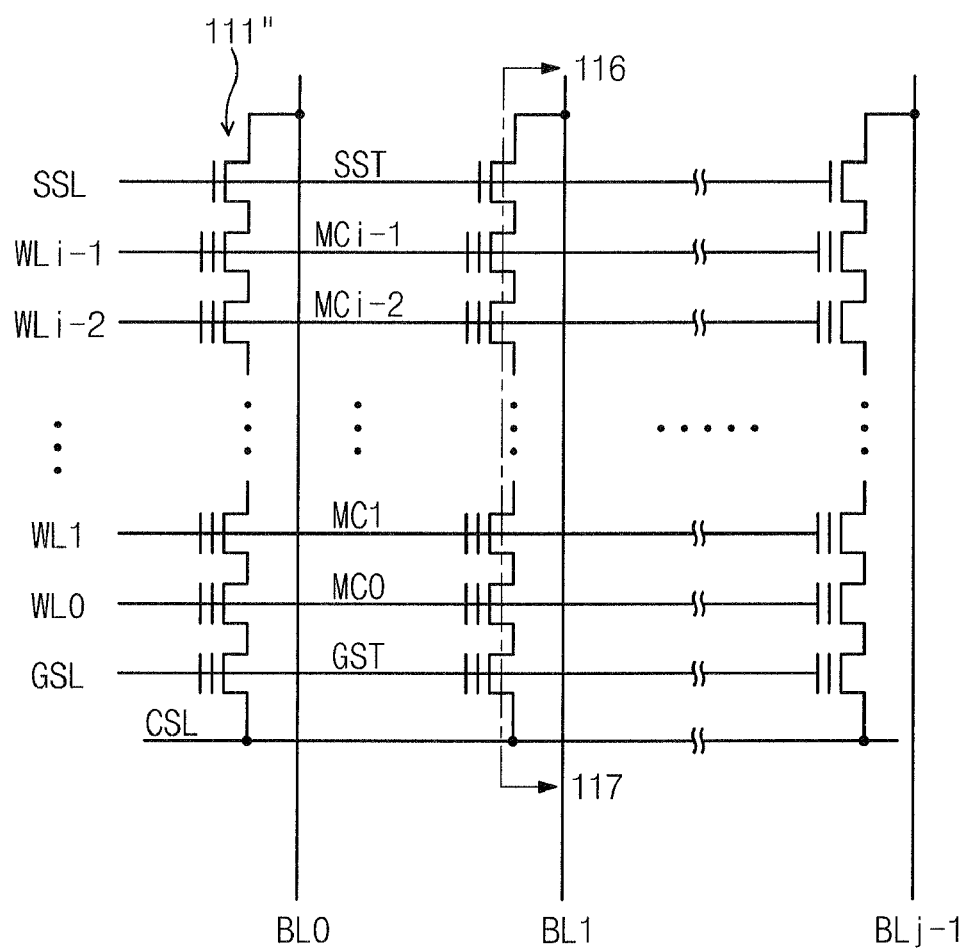
FIG. 22 is circuit diagram of a memory block comprising a NAND cell unit 111" having a programmable ground select transistor GST according to another embodiment of the present invention.

FIG. 22 is circuit diagram of a memory block comprising a NAND cell unit 111'' having a programmable ground select transistor GST according to another embodiment of the present invention. Referring to FIG. 1 and FIG. 22, in a memory cell array 110, NAND cell units 111'' are arranged in row and column directions in a matrix form, and connected to control gate lines (e.g., word lines $WL_0$-$WL_{i-1}$), bit lines (BL0, BL1, BL2 ... $BL_{j-1}$), string and ground selection lines (SSL, GSL), and source lines (CSL). Selected ones of the control gate lines ($WL_0$-$WL_{i-1}$) and selection gate lines (SSL, GSL), in the memory cell array 110 are selected during erase, programming, verification, and read operations.

The memory storage cells (MC0, MC1, MCi-2, MCi-1) may be memory transistors of the floating gate type, and in that case the ground selection transistors GST may also be memory transistors of the floating gate type and so there is no butting contact between the control gate and the floating gate in the ground selection transistors GST. However, in this exemplary embodiment of the invention, the string selection transistors SST are not memory transistors and are not programmable. Thus, as shown in FIG. 23 there may be provided a butting contact SSL-via between the control gate and the dummy floating gate of each string selection transistor SST.

FIG. 23 is a side cross-sectional view of a NAND cell unit 111'' in an integrated circuit according to the another embodiment of the present invention, along section line 116-117 in FIG. 22. The NAND cell unit 111'' of FIG. 22 is formed on a semiconductor substrate 100-1. The channel of the NAND cell unit 111'' is formed in the semiconductor substrate 100-1 between the selection transistors SST and GST. The channel of the NAND cell unit 111'' may be isolated from channels of other adjacent NAND cell units by shallow trench isolation (STI) (not shown), that prevents electrical current leakage between adjacent semiconductor device components. In this exemplary embodiment, only the ground selection transistor GST and not the string select transistor SST are memory transistors. Thus, only the ground selection transistor GST has both a control gate (GSL) and a floating gate (GST-FG). And, the string selection transistor SST has a control gate (SSL) connected to a dummy floating gate (SST-FG) by a butting contact SSL-via, and the dummy floating gate functions as the control gate of the string selection transistor SST.

The memory storage cells MC (MC0, MC1, MCi-2, MCi-1) may be memory transistors of the floating gate type, and in that case the ground selection transistors GST may be memory transistors of the floating gate type and there is no butting contact between the control gates (GSL) and the floating gates (GST-FG) of each ground selection transistors GST.

In accordance with an exemplary embodiment of the invention, the ground selection transistors GST are programmable memory transistors, and the gate lengths of the control gates of ground selection transistors GST may be the same as the gate length of the control gates of the memory storage cells MC (MC0, MC1, MCi-2, MCi-1).

Figure 24:
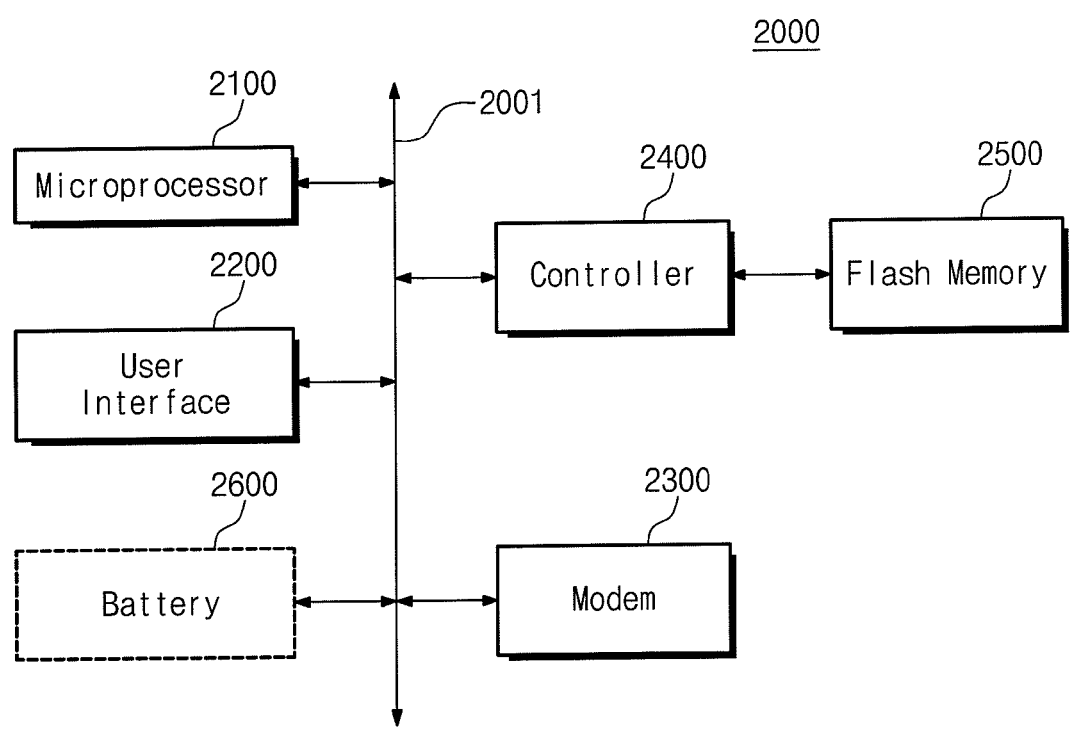
FIG. 24 is a block diagram of a computer system including a removable memory card 1210 including a flash memory device 100 of FIG. 1.

FIG. 24 is a block diagram of a computer system including a computer 20 hosting a removable memory card 10 including a flash memory device according to an embodiment of the present invention. The memory card 10 further includes a flash memory controller (not shown) which controls data flow and commands between a memory interface I/F 25 in the host computer 20 and the flash memory transistors (not shown) in the memory card 10. Examples of the computer 20 include personal computers, file servers, peripheral devices, wireless devices, digital cameras, personal digital assistants (PDA's), MP3 audio players, MPEG video players, and audio recorders. The removable memory card will typically have a housing that has a predetermined form factor and interface, such as SD (Secure Digital), MS (memory stick), CF (compact flash), SMC (smart media), MMC (multi media), or XD (XD-Picture Card), PCMCIA, CardBus, IDE, EIDE, SATA, SCSI, universal serial bus e.g., a USB flash drive) etc.

It will be appreciated by those skilled in the art that additional circuitry and control signals can be provided, and that the computer system of FIG. 1 has been simplified.

FIG. 24 is a block diagram of a computer system 2000 including a flash memory system including a flash memory device 2500 according to an embodiment of the present invention. The flash memory device 2500 is coupled to a memory controller 2400 for accessing the flash memory transistor array in the flash memory device 2500. The flash memory device 2500 coupled to the memory controller 2400 forms part of the computer system 2000. Some examples of the computer system 2000 include personal computers, peripheral devices, wireless devices, digital cameras, personal digital assistants (PDA's), MP3 audio players, MPEG video players, digital audio recorders, and digital video recorders. The memory system can be a memory card-based hard-drive, a Solid State Disk SSD, a hybrid (SSD/magnetic) disk, a Camera Image Processor (CIS) or a memory core integrated with the CPU 2100.

The memory device 2500 of the memory system of FIG. 24 receives control signals across control lines from the system bus 2001 via the memory controller 2400 to control access to the memory transistor array in the memory device 2500. Access to the memory transistor array in the memory device 2500 is directed to one or more target memory transistors by integrated transistors in peripheral circuitry and via word lines and bit lines in the memory device 2500. Once the memory transistor array is accessed in response to the control signals and the address signals, data is written to or read from the memory transistors by the integrated transistors in the peripheral circuitry in the memory device 2500.

The memory device 2500 in the computer system 2000 of FIG. 6, and the memory device 100 in the memory card of FIG. 1 can be mounted in various package types, including Ball Grid Arrays (BGAs), Chip Scale Packages (CSPs), Plastic Leaded Chip Carrier (PLCC), Plastic Dual In-Line Package (PDIP), Multi Chip Package (MCP), Wafer-level Fabricated Package (WFP), Wafer-Level Processed Stack Package (WSP).

As described above, in memory devices in accordance with exemplary embodiments of the invention, memory transistors and selection transistors may be integrated and formed using the same process steps, thus increasing manufacturing efficiency.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A flash memory device, comprising:
a plurality of memory blocks, each memory block including a NAND cell unit having a first selection transistor connected in series to a plurality of memory cells controlled by respective wordlines, wherein the first selection transistor is a memory transistor usable for storing data,
wherein the first selection transistor is configured to have its threshold voltage variably programmed by a user to store different data.

2. The device of claim 1, wherein the NAND cell unit further comprises a second selection transistor connected in series to the plurality of memory cells, wherein the second selection transistor is a memory transistor.

3. The device of claim 2, wherein the first selection transistor is controlled by a string selection line and is a string selection transistor SST, and wherein the second selection transistor is controlled by a ground selection line and is a ground selection transistor GST.

4. The device of claim 1, wherein the first selection transistor is configured to be verified to have a corresponding threshold voltage after it has been programmed.

5. The device of claim 1, wherein the first selection transistor is configured to be program-inhibited.

6. The device of claim 5, wherein the program-inhibiting of the first selection transistor is performed by bitline biasing of a bitline connected to the first selection transistor.

7. The device of claim 6, wherein the bitline biasing comprises applying to the bitline a voltage higher than zero.

8. The device of claim 1, wherein the first selection transistor is a memory transistor having a control gate and a floating gate.

9. The device of claim 8, wherein the control gate of the first selection transistor is formed devoid of a butting contact to its floating gate.

10. The device of claim 9, wherein the gate length of the control gate of the first selection transistor is substantially the same the gate length of the control gates of the memory transistors connected to the wordlines.

11. The device of claim 1, wherein the first selection transistor is a ground selection transistor GST.

12. The device of claim 1, wherein the NAND cell unit further comprises a second selection transistor connected in series to the plurality of memory cells, wherein the second selection transistor is not a memory transistor.

13. A solid state memory module for a computer system, the module comprising:
a housing;
an interface connector on the housing;
a flash memory controller located within the housing;
the flash memory device of claim 1 located within the housing and electrically connected to the interface connector, the plurality of memory transistors in the flash memory device being arranged in an array for data storage and controlled by the flash memory controller.

14. The solid state memory module of claim 13, wherein the interface connector is an IDE interface connector including an IDE pin interface and a power connector.

15. The solid state memory module of claim 13, wherein the housing has an SD card form factor and the interface connector has multiple electrical contact pads.

16. The solid state memory module of claim 13, wherein the housing has the form factor of a selection from the group consisting of a MS (memory stick), CF (compact flash), SMC (smart media), MMC (multi media), SD (Secure Digital), or XD (XD-Picture Card).

17. A computer system comprising the solid state memory module of claim 13.

18. The computer system of claim 17, wherein the computer system is one of the group consisting of a personal computer (PC), a personal digital assistant (PDA), an MP3 player, a digital audio recorder, a pen-shaped computer, a digital camera, or a video recorder.

* * * * *